United States Patent
Juneja et al.

(10) Patent No.: US 10,296,703 B1
(45) Date of Patent: May 21, 2019

(54) SYSTEM AND METHOD FOR VISUALIZATION IN AN ELECTRONIC CIRCUIT DESIGN

(71) Applicant: Cadence Design Systems, Inc., San Jose, CA (US)

(72) Inventors: Pardeep Juneja, Delhi (IN); Jean-Marc Bourguet, Puget-sur-Argens (FR); Joyjeet Bose, Uttar Pradesh (IN); Sachin Shrivastava, Uttar Pradesh (IN); Yashu Gupta, Uttar Pradesh (IN); Ankur Chaplot, Uttar Pradesh (IN)

(73) Assignee: Cadence Design Systems, Inc., San Jose, CA (US)

( * ) Notice: Subject to any disclaimer, the term of this patent is extended or adjusted under 35 U.S.C. 154(b) by 0 days.

(21) Appl. No.: 15/709,948

(22) Filed: Sep. 20, 2017

(51) Int. Cl.
  *G06F 17/50* (2006.01)

(52) U.S. Cl.
  CPC ...... *G06F 17/5081* (2013.01); *G06F 17/5068* (2013.01)

(58) Field of Classification Search
  CPC .................. G06F 17/5081; G06F 17/5068
  See application file for complete search history.

(56) References Cited

U.S. PATENT DOCUMENTS

| | | | | | |
|---|---|---|---|---|---|
| 5,923,566 | A * | 7/1999 | Galan | ............... | G03F 7/70441 430/311 |
| 6,782,516 | B2 * | 8/2004 | Rittman | ............... | G06F 17/5081 716/52 |
| 6,829,753 | B2 * | 12/2004 | Lee | ............... | B01F 15/00935 716/112 |
| 7,117,476 | B2 * | 10/2006 | Bach | ............... | G06F 17/5081 716/52 |
| 7,155,689 | B2 * | 12/2006 | Pierrat | ............... | G06F 17/5036 716/52 |
| 7,175,943 | B2 * | 2/2007 | Asano | ............... | G03F 7/70466 430/30 |
| 7,275,227 | B1 * | 9/2007 | Ying | ............... | G03F 1/36 716/52 |
| 7,284,214 | B2 * | 10/2007 | LeBritton | ............... | G06F 17/5081 716/52 |
| 7,315,990 | B2 * | 1/2008 | Archambeault | ............... | G06F 17/5081 716/112 |
| 7,653,892 | B1 * | 1/2010 | Gennari | ............... | G06F 17/5068 716/50 |
| 7,784,019 | B1 * | 8/2010 | Zach | ............... | G06F 17/5068 716/123 |

(Continued)

*Primary Examiner* — Naum Levin
(74) *Attorney, Agent, or Firm* — Mark H. Whittenberger, Esq.; Holland & Knight LLP

(57) ABSTRACT

The present disclosure relates to a system and method for visualization of fixing of design rule violations in an electronic circuit design. Embodiments may include displaying at a graphical user interface at least a portion of an electronic design having at least one shape associated therewith and identifying one or more electronic design rules associated with the at least one shape. In response to identifying, embodiments may include determining a proposed shape based upon, at least in part, the one or more electronic design rules associated with the at least one shape, wherein the proposed shape is at least one of a trim shape, a bridge shape, and a patch shape and displaying the proposed shape at the graphical user interface.

20 Claims, 55 Drawing Sheets
(53 of 55 Drawing Sheet(s) Filed in Color)

(56) References Cited

U.S. PATENT DOCUMENTS

| | | | | |
|---|---|---|---|---|
| 7,917,871 B2* | 3/2011 | Kobayashi | G06F 17/5081 | 438/14 |
| 8,108,804 B2* | 1/2012 | Graur | G03F 1/36 | 382/144 |
| 8,330,159 B2* | 12/2012 | Large | H01L 22/22 | 257/48 |
| 8,434,043 B1* | 4/2013 | Hsu | G06F 17/5081 | 716/112 |
| 8,516,402 B1* | 8/2013 | Wang | G03F 1/70 | 716/52 |
| 8,555,237 B1* | 10/2013 | Juneja | G06F 17/5081 | 716/111 |
| 8,640,079 B2* | 1/2014 | Majumder | G06F 17/50 | 716/100 |
| 8,677,293 B2* | 3/2014 | Jensen | G06F 17/5068 | 703/22 |
| 8,732,631 B2* | 5/2014 | Fang | G06F 17/5045 | 716/102 |
| 8,775,979 B2* | 7/2014 | Oberai | G06F 17/50 | 716/100 |
| 8,775,983 B1* | 7/2014 | Wang | G03F 7/70433 | 716/52 |
| 8,782,577 B2* | 7/2014 | Fischer | G06F 17/5068 | 716/100 |
| 8,863,048 B1* | 10/2014 | Gerousis | G06F 17/5072 | 716/100 |
| 9,330,221 B2* | 5/2016 | Yuan | G06F 17/5077 | |
| 9,330,225 B2* | 5/2016 | Chaudhary | G06F 17/5081 | |
| 9,384,319 B2* | 7/2016 | Cilingir | G03F 1/36 | |
| 9,418,196 B2* | 8/2016 | Chen | G06F 17/5081 | |
| 9,652,579 B1* | 5/2017 | Arkhipov | G06F 17/5081 | |
| 9,740,814 B1* | 8/2017 | Ghosh | G03F 7/70 | |
| 10,083,269 B2* | 9/2018 | De Dood | G06F 17/5068 | |
| 2004/0153987 A1* | 8/2004 | Culler | G06F 17/5068 | 716/122 |
| 2005/0138591 A1* | 6/2005 | Shirai | G06F 17/5081 | 716/111 |
| 2007/0124709 A1* | 5/2007 | Li | G06F 17/5081 | 716/112 |
| 2008/0086709 A1* | 4/2008 | Rittman | G06F 17/5081 | 716/52 |
| 2008/0115102 A1* | 5/2008 | Rittman | G06F 17/5068 | 716/52 |
| 2015/0286771 A1* | 10/2015 | Choi | G06F 17/5081 | 716/51 |

* cited by examiner

Using SADP (Self Aligned Dual Patterning) lines

- SADP can draw thin lines close to each other

- But real design needs something more meaningful

SYSTEM AND METHOD FOR VISUALIZATION IN AN ELECTRONIC CIRCUIT DESIGN

FIELD OF THE INVENTION

The present disclosure relates to electronic circuit design and more specifically, to a system and method for visualization at a graphical user interface associated with the design of electronic circuits.

DISCUSSION OF THE RELATED ART

Electronic circuit manufacturers recommend a set of rules that should be followed in order to maximize the chances of obtaining a functioning chip. These rules provide an interface between the design engineer and the process engineer, which may help to ensure that what a circuit designer actually designs is what is eventually produced. Each electronic circuit design company may have a set of additional rules. Some of these may include electrical design rule checks, physical design rule checks, layout vs. schematics, etc.

Design Rule Checks include a broad umbrella of specifications that try to maximize the probability of manufacturability and correct functioning of the chip. There are many reasons why they are needed, related to the manufacturing process itself (e.g., resolution of optical lithography equipment, amount of undercutting during etching steps, control over lateral diffusion, control over junction depth, etc.).

SUMMARY

In one or more embodiments of the present disclosure, a method may include displaying at a graphical user interface at least a portion of an electronic design having at least one shape associated therewith and identifying one or more electronic design rules associated with the at least one shape. In response to identifying, the method may include determining a proposed shape based upon, at least in part, the one or more electronic design rules associated with the at least one shape, wherein the proposed shape is at least one of a trim shape, a bridge shape, and a patch shape and displaying the proposed shape at the graphical user interface.

One or more of the following features may be included. The method may include identifying a line end violation associated with the electronic design. The method may further include displaying the line end violation at the graphical user interface. In some embodiments, the proposed shape may include at least two of a trim shape, a bridge shape, and a patch shape. In some embodiments, displaying at a graphical user interface at least a portion of an electronic design may include displaying a first static portion of the design and displaying a portion of the electronic design that is configured to dynamically change upon user selection. In some embodiments, the proposed shape may connect the first static portion of the electronic design and the portion of the electronic design that is configured to dynamically change upon user selection. The portion of the electronic design that is configured to dynamically change upon user selection may include a wire. The method may include allowing, at the graphical user interface a user to select a sub-portion of the electronic design within to display the proposed shape.

In one or more embodiments of the present disclosure, a system for visualization of fixing of design rule violations in an electronic circuit design is provided. The system may include a computing device having at least one processor configured to display at a graphical user interface at least a portion of an electronic design having at least one shape associated therewith. The computing device may be further configured to identify one or more electronic design rules associated with the at least one shape, and in response to identifying, the computing device may be further configured to determine a proposed shape based upon, at least in part, the one or more electronic design rules associated with the at least one shape, wherein the proposed shape is at least one of a trim shape, a bridge shape, and a patch shape. The computing device may be configured to display the proposed shape at the graphical user interface.

One or more of the following features may be included. The computing device may be further configured to identify a line end violation associated with the electronic design. The computing device may be further configured to display the line end violation at the graphical user interface. The proposed shape may include at least two of a trim shape, a bridge shape, and a patch shape. In some embodiments, displaying at a graphical user interface at least a portion of an electronic design may include displaying a first static portion of the design and displaying a portion of the electronic design that is configured to dynamically change upon user selection. The proposed shape may connect the first static portion of the electronic design and the portion of the electronic design that is configured to dynamically change upon user selection. The portion of the electronic design that is configured to dynamically change upon user selection may include a wire. The computing device may be further configured to allow a user to select a sub-portion of the electronic design within to display the proposed shape at the graphical user interface.

In one or more embodiments of the present disclosure, a non-transitory computer readable medium having stored thereon instructions, which when executed by a processor result in one or more operations is provided. Operations may include displaying at a graphical user interface at least a portion of an electronic design having at least one shape associated therewith. Operations may also include identifying one or more electronic design rules associated with the at least one shape and, in response to identifying, determining a proposed shape based upon, at least in part, the one or more electronic design rules associated with the at least one shape. Operations may further include displaying the proposed shape at the graphical user interface.

One or more of the following features may be included. Operations may include identifying a line end violation associated with the electronic design. Operations may also include displaying the line end violation at the graphical user interface. In some embodiments, the proposed shape may be at least one of a trim shape, a bridge shape, and a patch shape.

Additional features and advantages of embodiments of the present disclosure will be set forth in the description which follows, and in part will be apparent from the description, or may be learned by practice of embodiments of the present disclosure. The objectives and other advantages of the embodiments of the present disclosure may be realized and attained by the structure particularly pointed out in the written description and claims hereof as well as the appended drawings.

It is to be understood that both the foregoing general description and the following detailed description are exemplary and explanatory and are intended to provide further explanation of embodiments of the invention as claimed.

BRIEF DESCRIPTION OF THE DRAWINGS

The accompanying drawings, which are included to provide a further understanding of embodiments of the present disclosure and are incorporated in and constitute a part of this specification, illustrate embodiments of the present disclosure and together with the description serve to explain the principles of embodiments of the present disclosure. The patent or application file contains at least one drawing executed in color. Copies of this patent or patent application publication with color drawing(s) will be provided by the Office upon request and payment of the necessary fee.

DETAILED DESCRIPTION

Reference will now be made in detail to the embodiments of the present disclosure, examples of which are illustrated in the accompanying drawings. The present disclosure may, however, be embodied in many different forms and should not be construed as being limited to the embodiments set forth herein. Rather, these embodiments are provided so that this disclosure will be thorough and complete, and will fully convey the concept of the disclosure to those skilled in the art.

Figure 1:
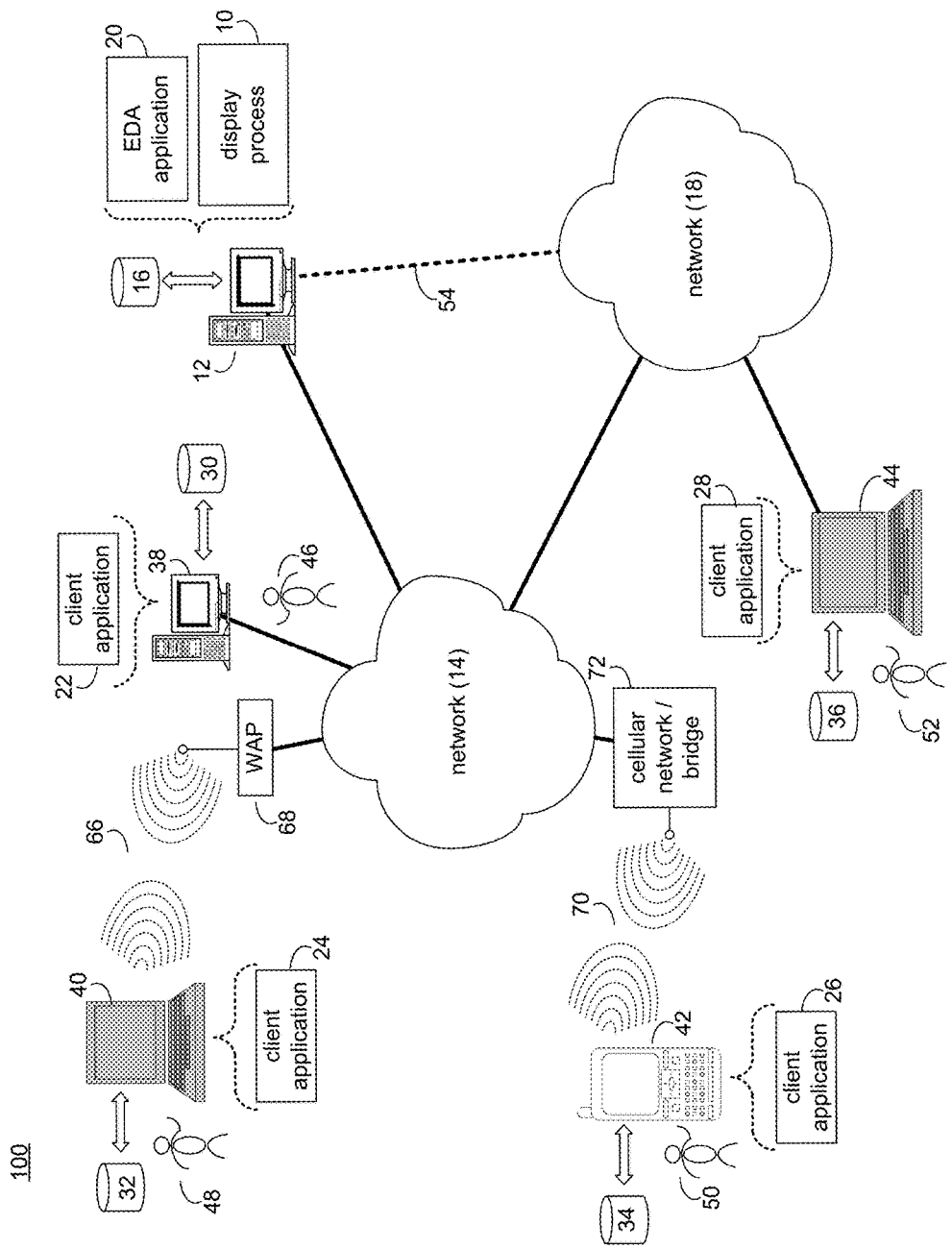
FIG. 1 is a system diagram depicting aspects of the display process in accordance with an embodiment of the present disclosure.

Referring to FIG. 1, there is shown display process 10 that may reside on and may be executed by server computer 12, which may be connected to network 14 (e.g., the Internet or a local area network). Examples of server computer 12 may include, but are not limited to: a personal computer, a server computer, a series of server computers, a mini computer, and a mainframe computer. Server computer 12 may be a web server (or a series of servers) running a network operating system, examples of which may include but are not limited to: Microsoft® Windows® Server; Novell® NetWare®; or Red Hat® Linux®, for example. (Microsoft and Windows are registered trademarks of Microsoft Corporation in the United States, other countries or both; Novell and NetWare are registered trademarks of Novell Corporation in the United States, other countries or both; Red Hat is a registered trademark of Red Hat Corporation in the United States, other countries or both; and Linux is a registered trademark of Linus Torvalds in the United States, other countries or both.) Additionally/alternatively, the display process may reside on and be executed, in whole or in part, by a client electronic device, such as a personal computer, notebook computer, personal digital assistant, or the like.

The instruction sets and subroutines of display process 10, which may include one or more software modules, and which may be stored on storage device 16 coupled to server computer 12, may be executed by one or more processors (not shown) and one or more memory modules (not shown) incorporated into server computer 12. Storage device 16 may include but is not limited to: a hard disk drive; a solid state drive, a tape drive; an optical drive; a RAID array; a random access memory (RAM); and a read-only memory (ROM). Storage device 16 may include various types of files and file types.

Server computer 12 may execute a web server application, examples of which may include but are not limited to: Microsoft IIS, Novell Webserver™, or Apache® Webserver, that allows for HTTP (e.g., HyperText Transfer Protocol) access to server computer 12 via network 14 (Webserver is a trademark of Novell Corporation in the United States, other countries, or both; and Apache is a registered trademark of Apache Software Foundation in the United States, other countries, or both). Network 14 may be connected to one or more secondary networks (e.g., network 18), examples of which may include but are not limited to: a local area network; a wide area network; or an intranet, for example.

Server computer 12 may execute an electronic design automation (EDA) application (e.g., EDA application 20), examples of which may include, but are not limited to those available from the assignee of the present application. EDA application 20 may interact with one or more EDA client applications (e.g., EDA client applications 22, 24, 26, 28). EDA application 20 may be referred to herein as a design tool.

Display process 10 may be a stand-alone application, or may be an applet/application/script that may interact with and/or be executed within EDA application 20. In addition/as an alternative to being a server-side process, the display process may be a client-side process (not shown) that may reside on a client electronic device (described below) and may interact with an EDA client application (e.g., one or more of EDA client applications 22, 24, 26, 28). Further, the display process may be a hybrid server-side/client-side process that may interact with EDA application 20 and an EDA client application (e.g., one or more of client applications 22, 24, 26, 28). As such, the display process may reside, in whole, or in part, on server computer 12 and/or one or more client electronic devices.

The instruction sets and subroutines of EDA application 20, which may be stored on storage device 16 coupled to server computer 12 may be executed by one or more processors (not shown) and one or more memory modules (not shown) incorporated into server computer 12.

The instruction sets and subroutines of EDA client applications 22, 24, 26, 28, which may be stored on storage devices 30, 32, 34, 36 (respectively) coupled to client electronic devices 38, 40, 42, 44 (respectively), may be executed by one or more processors (not shown) and one or more memory modules (not shown) incorporated into client electronic devices 38, 40, 42, 44 (respectively). Storage devices 30, 32, 34, 36 may include but are not limited to: hard disk drives; solid state drives, tape drives; optical drives; RAID arrays; random access memories (RAM); read-only memories (ROM), compact flash (CF) storage devices, secure digital (SD) storage devices, and a memory stick storage devices. Examples of client electronic devices 38, 40, 42, 44 may include, but are not limited to, personal computer 38, laptop computer 40, mobile computing device 42 (such as a smart phone, netbook, or the like), notebook computer 44, for example. Using client applications 22, 24, 26, 28, users 46, 48, 50, 52 may access EDA application 20 and may allow users to e.g., utilize display process 10.

Users 46, 48, 50, 52 may access EDA application 20 directly through the device on which the client application (e.g., client applications 22, 24, 26, 28) is executed, namely client electronic devices 38, 40, 42, 44, for example. Users 46, 48, 50, 52 may access EDA application 20 directly through network 14 or through secondary network 18. Further, server computer 12 (e.g., the computer that executes EDA application 20) may be connected to network 14 through secondary network 18, as illustrated with phantom link line 54.

In some embodiments, current estimation process 10 may be a cloud-based process as any or all of the operations described herein may occur, in whole, or in part, in the cloud or as part of a cloud-based system. The various client electronic devices may be directly or indirectly coupled to network 14 (or network 18). For example, personal computer 38 is shown directly coupled to network 14 via a hardwired network connection. Further, notebook computer 44 is shown directly coupled to network 18 via a hardwired network connection. Laptop computer 40 is shown wirelessly coupled to network 14 via wireless communication channel 66 established between laptop computer 40 and wireless access point (e.g., WAP) 68, which is shown directly coupled to network 14. WAP 68 may be, for example, an IEEE 802.11a, 802.11b, 802.11g, Wi-Fi, and/or Bluetooth device that is capable of establishing wireless communication channel 66 between laptop computer 40 and WAP 68. Mobile computing device 42 is shown wirelessly coupled to network 14 via wireless communication channel 70 established between mobile computing device 42 and cellular network/bridge 72, which is shown directly coupled to network 14.

As is known in the art, all of the IEEE 802.11x specifications may use Ethernet protocol and carrier sense multiple access with collision avoidance (e.g., CSMA/CA) for path sharing. The various 802.11x specifications may use phase-shift keying (e.g., PSK) modulation or complementary code keying (e.g., CCK) modulation, for example. As is known in the art, Bluetooth is a telecommunications industry specification that allows e.g., mobile phones, computers, and personal digital assistants to be interconnected using a short-range wireless connection.

Client electronic devices 38, 40, 42, 44 may each execute an operating system, examples of which may include but are not limited to Microsoft Windows, Microsoft Windows CE®, Red Hat Linux, or other suitable operating system. (Windows CE is a registered trademark of Microsoft Corporation in the United States, other countries, or both).

Figure 2:
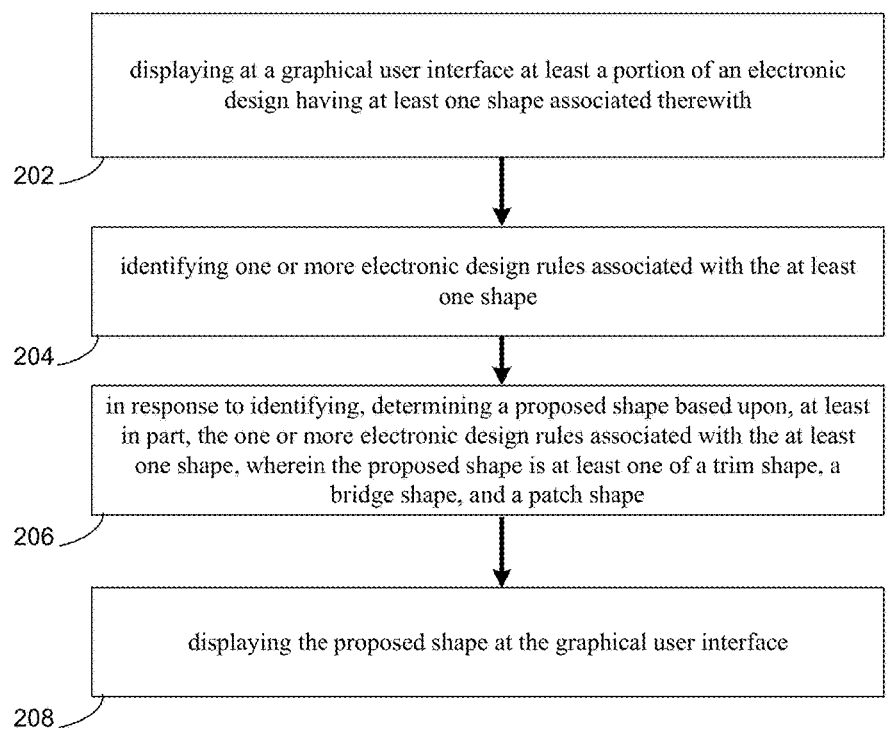
FIG. 2 is a flowchart depicting operations consistent with the display process of the present disclosure.
Figure 55:
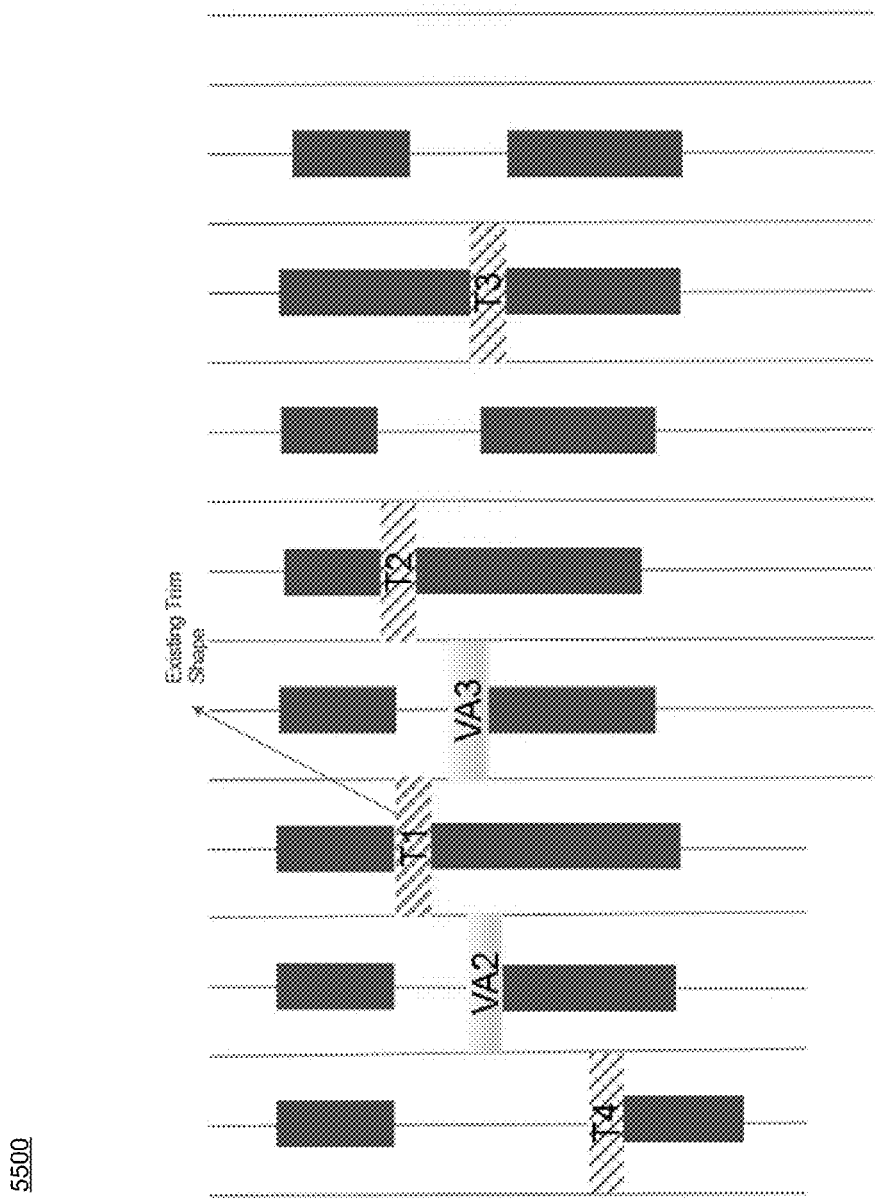
FIG. 55 is a diagram depicting an embodiment incorporating display process in accordance with the present disclosure.

Referring to FIGS. 2-55, various embodiments consistent with display process 10 are provided. As shown in FIG. 2, embodiments of display process 10 may be used in for visualization of fixing of design rule violations in an electronic circuit design. Embodiments may include displaying at a graphical user interface at least a portion of an electronic design having at least one shape associated therewith and identifying one or more electronic design rules associated with the at least one shape. In response to identifying, embodiments may include determining a proposed shape based upon, at least in part, the one or more electronic design rules associated with the at least one shape, wherein the proposed shape is at least one of a trim shape, a bridge shape, and a patch shape and displaying the proposed shape at the graphical user interface.

Advanced process node technologies, in which long thin line segments are realized through a Self-Aligned Dual Pattern technique (SADP) metal may need to have the metal cut at various points for realization of properly operating circuit. In this approach metal segments may be placed end to end at much smaller spacing levels thereby having higher density. To achieve this metal ends may need to be filled with another metal and a cut-metal mask may be introduced to etch metal shapes. Accordingly, embodiments of the present disclosure involve the visualization of fixing of line end design rule violations using a cut metal insertion during an interactive layout design.

Currently, these cut-metal masks may be generated manually or by use of post processing skill scripts. However, these approaches are not scalable for large designs, are limited to a small set of design rules compliance, the trim mask is a part of post processing and thus not available early in design layout process, and these approaches are difficult to optimize along with early design layout steps (e.g. placement/alignment etc.).

In some embodiments, the display process 10 described herein may provide an infrastructure and methodology that aims to provide users with a way to visualize cut metal (trim mask) insertion during interactive custom layout designing. In this way, during interactive layout designing, display process 10 may determine any line end design rule violations and automatically compute required trim mask shapes in the presence of other neighboring shapes present on same/different tracks and present these to designer on layout canvas. These details may be presented to a designer in such a way that makes it easier for them to understand the line end violations in their entirety within the context of the layout. Display process 10 may also relate it to the actual constraint and the detailed information from the constraint that came into play causing the violation. Display process 10 may also resolve a design rule violation by committing a suggested trim mask shape insertion to the electronic design.

Figure 3:
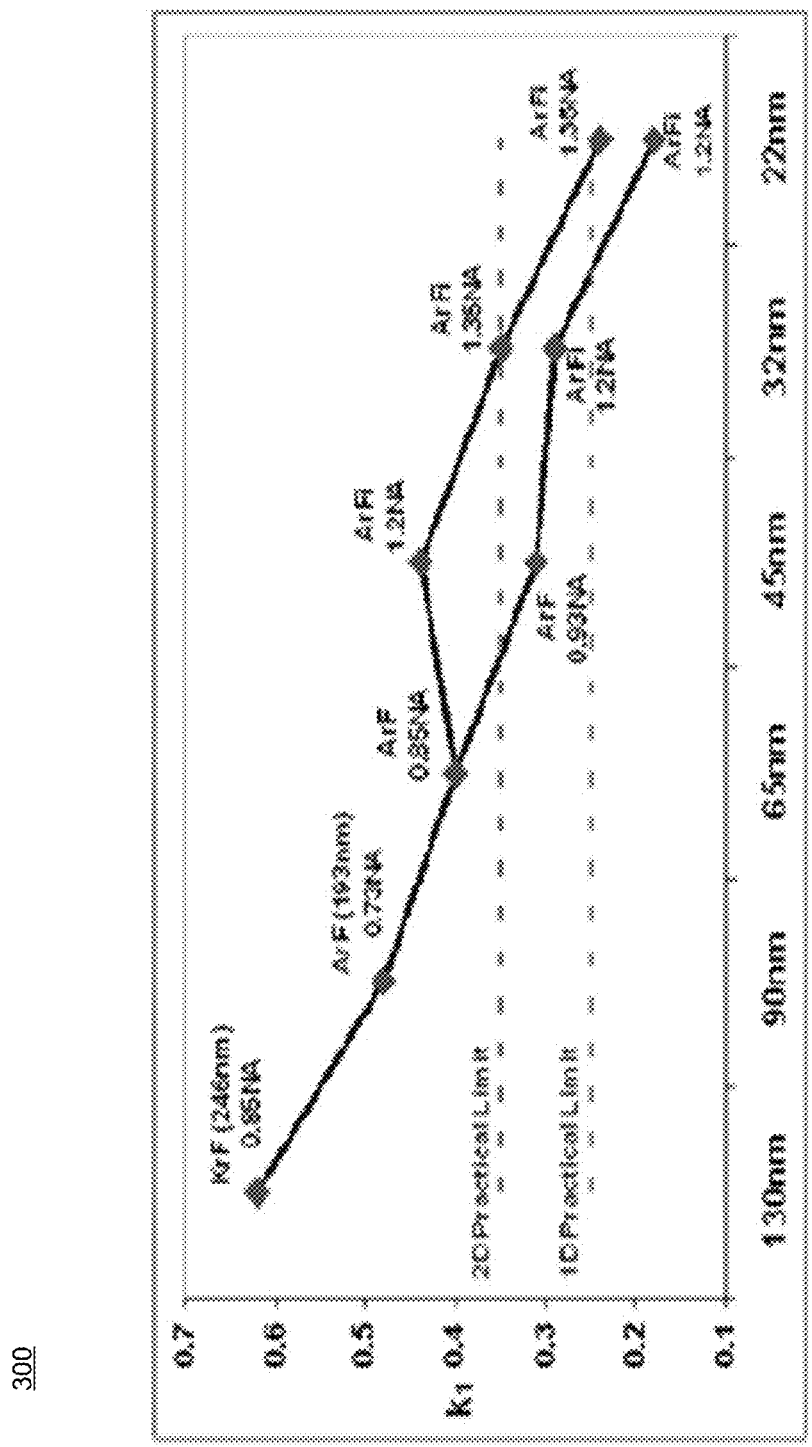
FIG. 3 is a diagram depicting an embodiment incorporating display process in accordance with the present disclosure.
Figure 4:
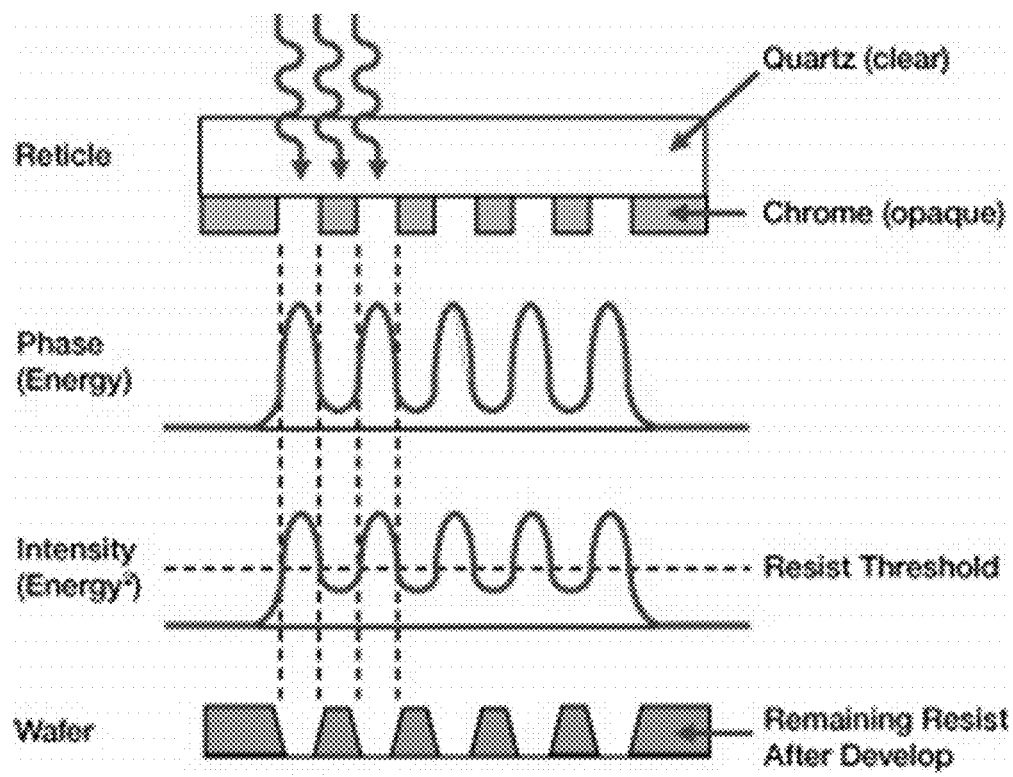
FIG. 4 is a diagram depicting an embodiment incorporating display process in accordance with the present disclosure.

Referring also to FIGS. 3-4, embodiments depicting examples of design rules are provided. Manufacturability can be approximated in terms of k1. Similarly, the minimum feature size that may be printed is approximated in terms of k1:

$$R = k_1 \frac{\lambda}{NA}$$

where R is Resolution, λ is the wavelength of source, NA is numerical aperture, and k is the process complexity factor. A smaller λ is better, a larger NA is better and may depend on things like lens size. The maximum theoretical limit is 1.0 (practical limit is 0.93). A smaller k is better and with regular techniques it can be reduced up to 0.25. The focus currently is to reduce this factor and it may be reduced using some Resolution Enhancement Techniques (RET), which leads to some very complex design rules. The minimum feature size without RET=k λ/NA=0.25×193/0.93=52 nm.

Figure 5:
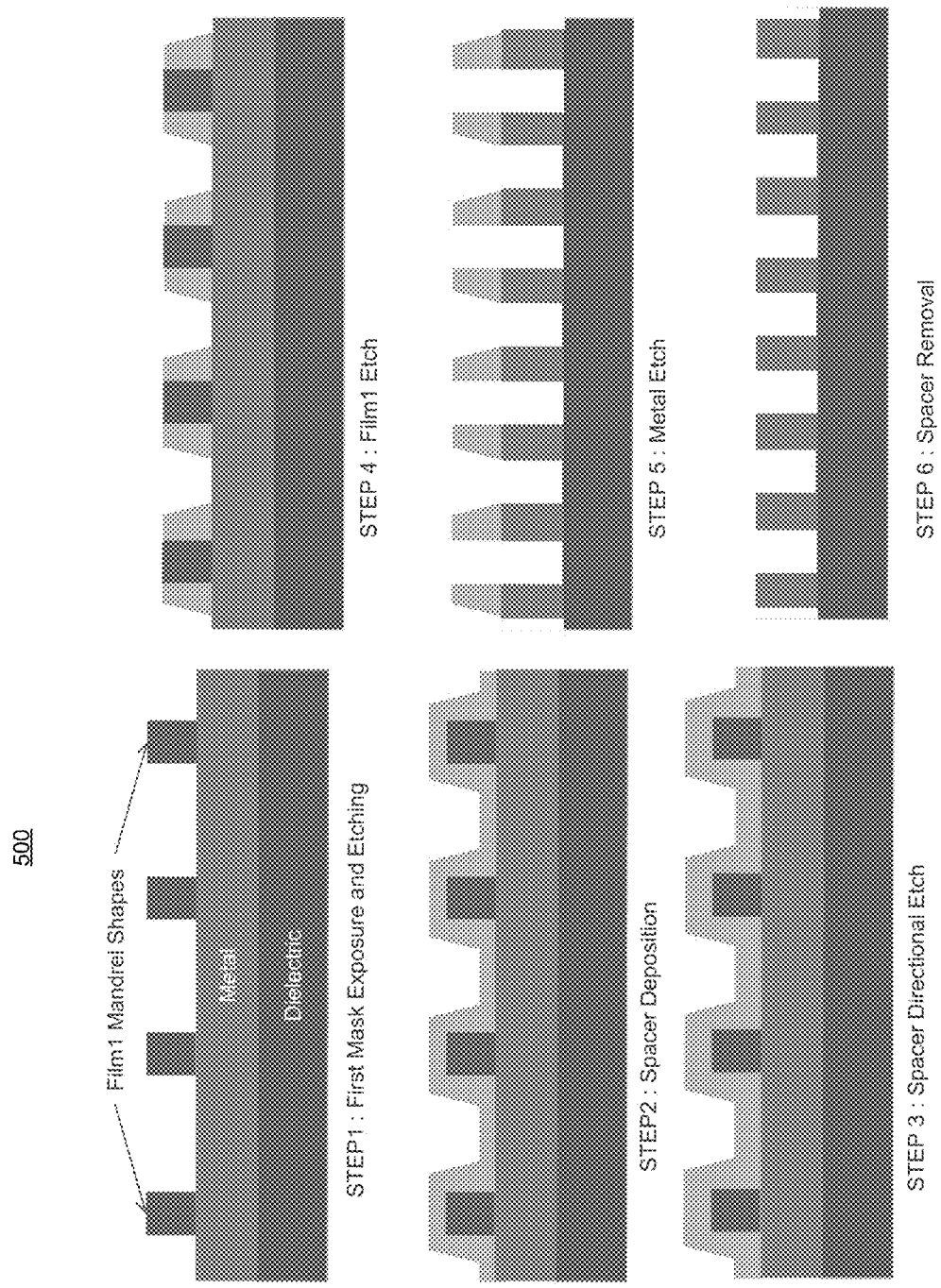
FIG. 5 is a diagram depicting an embodiment incorporating display process in accordance with the present disclosure.
Figure 6:
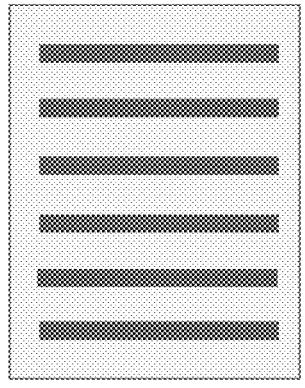
FIG. 6 is a diagram depicting an embodiment incorporating display process in accordance with the present disclosure.
Figure 6:
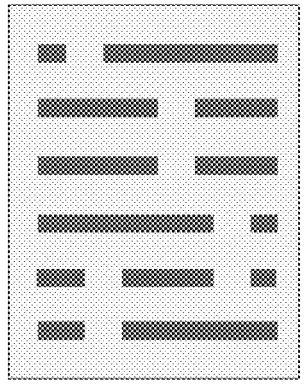

Some current resolution enhancement techniques include 65-32 nm (e.g., immersion lithography, off-axis illumination, and phase shift masks), ≤ 22 nm (LELE Double Patterning, Self-Aligned Double Patterning (SADP) with trim mask), and <10 nm (Self Aligned Double/Triple Patterning with colored trim mask). Embodiments showing examples of self-aligned dual patterning are provided in FIGS. 5-6.

Figure 7:
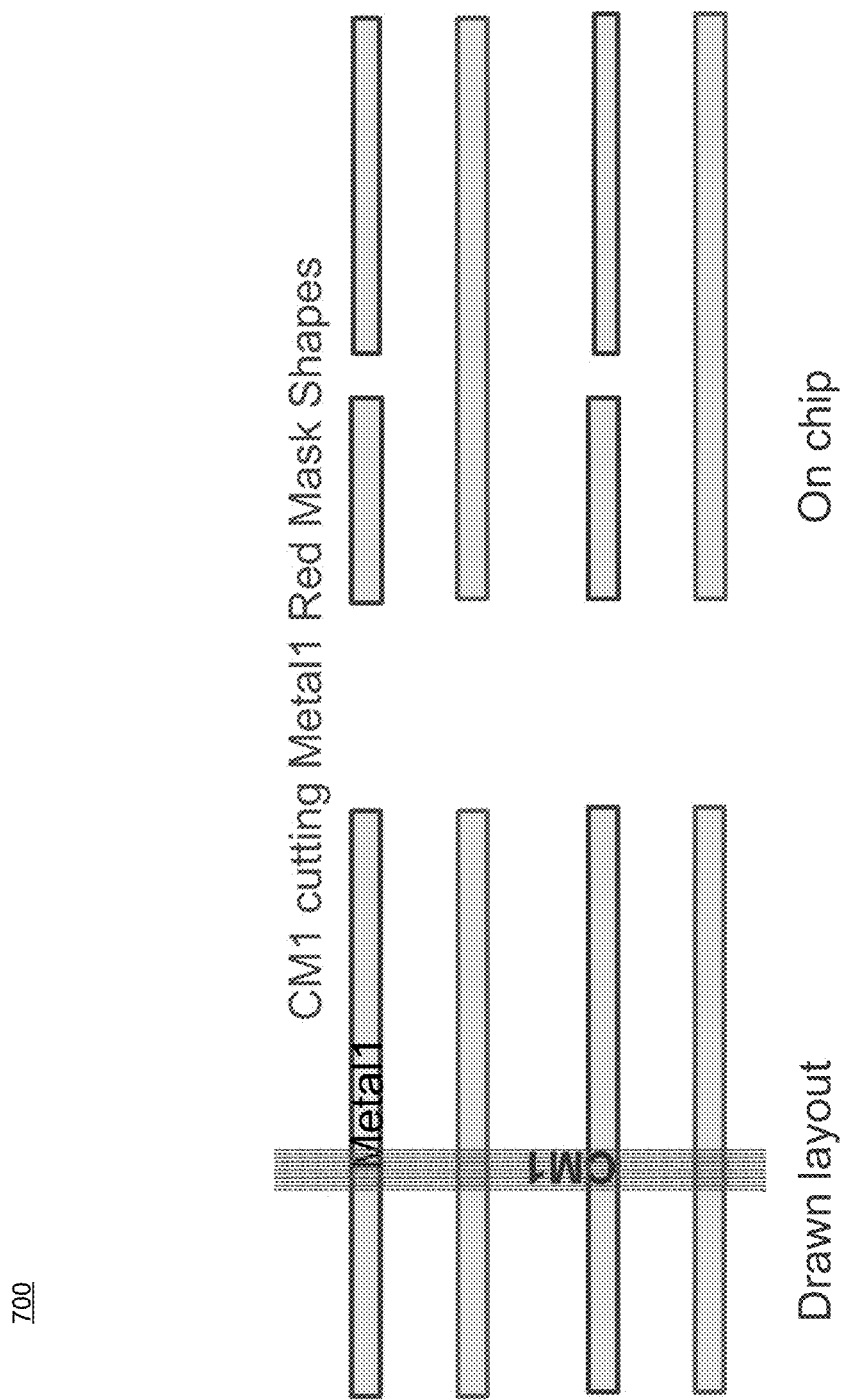
FIG. 7 is a diagram depicting an embodiment incorporating display process in accordance with the present disclosure.
Figure 8:
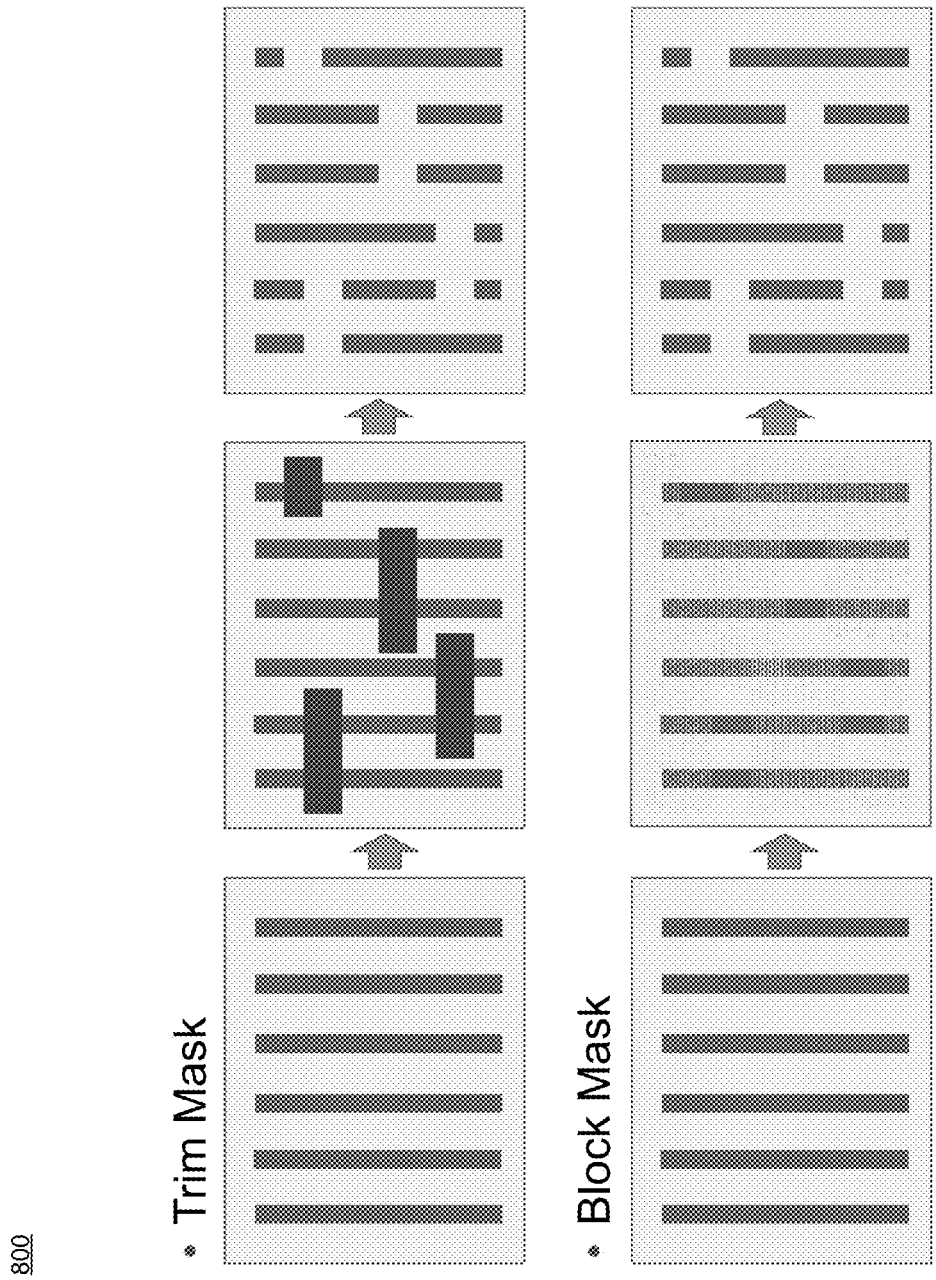
FIG. 8 is a diagram depicting an embodiment incorporating display process in accordance with the present disclosure.

Referring also to FIG. 7, an embodiment showing an example of cut metal or trim mask is provided. As used herein, a trim layer may also be referred to as a cut layer. In some embodiments, a cut metal or trim mask may be used to remove unnecessary shapes from thin lines drawn close to each other using self-aligned dual patterning techniques. In the example of FIG. 7, a trim mask (cut metal) is used to achieve smaller end-to-end spacing. The metal on one of the masks under the cut metal may be removed during processing. FIG. 8 depicts an example of a trim mask contrasted with a block mask shown below it. The trim mask shows the portions of the design to be removed and the block mask shows the portion of the mask that is to remain in the design.

As used herein, the term "static" may refer to a shape that already exists in a system and/or application. The term "dynamic" may refer to one or more shapes that may be created by a user. In some embodiments, some shapes, including, but not limited to trim shapes, bridge shapes, and patch shapes may be automatically generated depending on neighborhood context and one or more constraints specified in a design.

Figure 9:
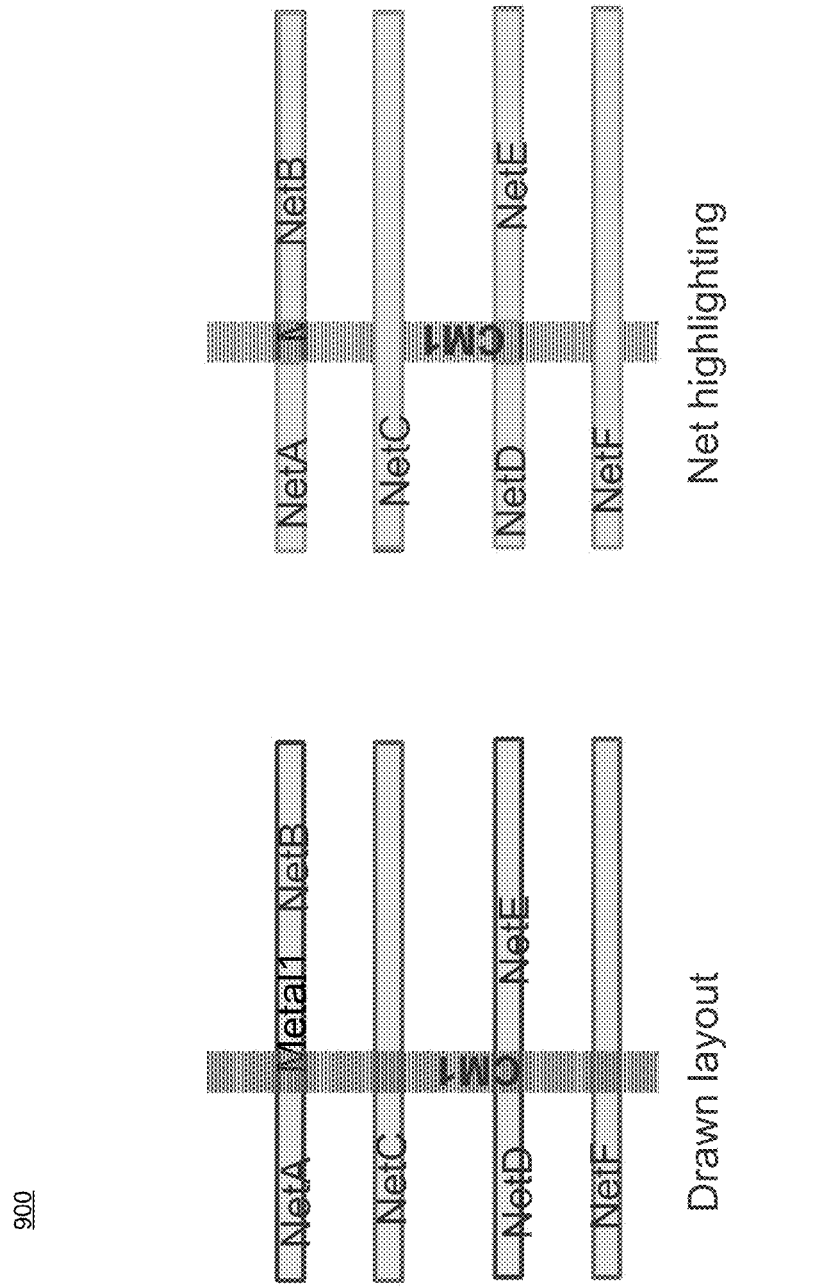
FIG. 9 is a diagram depicting an embodiment incorporating display process in accordance with the present disclosure.

Referring also to FIG. 9, an embodiment showing an example of a trim mask (Cut Metal) in a custom layout is provided. In this example, the metal and cut metal are drawn as they would appear on the mask. A connectivity extractor may derive the geometry that would result on the chip. In contrast, in existing approaches these trim masks are generated manually or by use of post processing skill scripts. These previous approaches are not scalable for large designs and are limited to a small set of design rules compliance. Moreover, in these previous approaches the trim mask is a part of post processing and thus not available early in design layout process, and, as such, it is difficult to optimize during early design layout steps (e.g. placement/alignment etc.).

Figure 10:
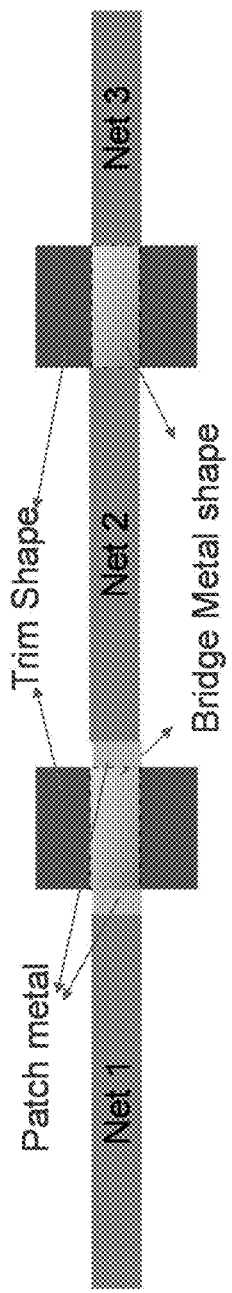
FIG. 10 is a diagram depicting an embodiment incorporating display process in accordance with the present disclosure.

Referring also to FIG. 10, an embodiment of display process 10 showing various shapes that may be employed in accordance with the present disclosure is provided. In some embodiments, some cut metal (trim mask) shapes may include, but are not limited to, trim mask (cut metal) shapes, bridge shapes (e.g., metal shapes that fill the space underneath a trim shape, which may not be manufactured but may still be needed for metal mask creation), patch shapes (e.g., shapes that fill the space between a trim shape and line end(s)). This may be achieved using any suitable approach, including, but not limited to, using new path segments, extending existing line end(s), etc.

In some embodiments, and as used herein, a trim mask or cut metal shape may be configured so as not to construct an underlying metal shape at that location. A bridge shape may be one or more metal shapes that fill the space underneath a trim shape, which may not be manufactured but may be needed for a metal mask creation. A patch shape may refer to a shape that may fill the space between a trim shape and a line end(s). This may be achieved either by a new path segment or extending an existing line end(s).

Figure 11:
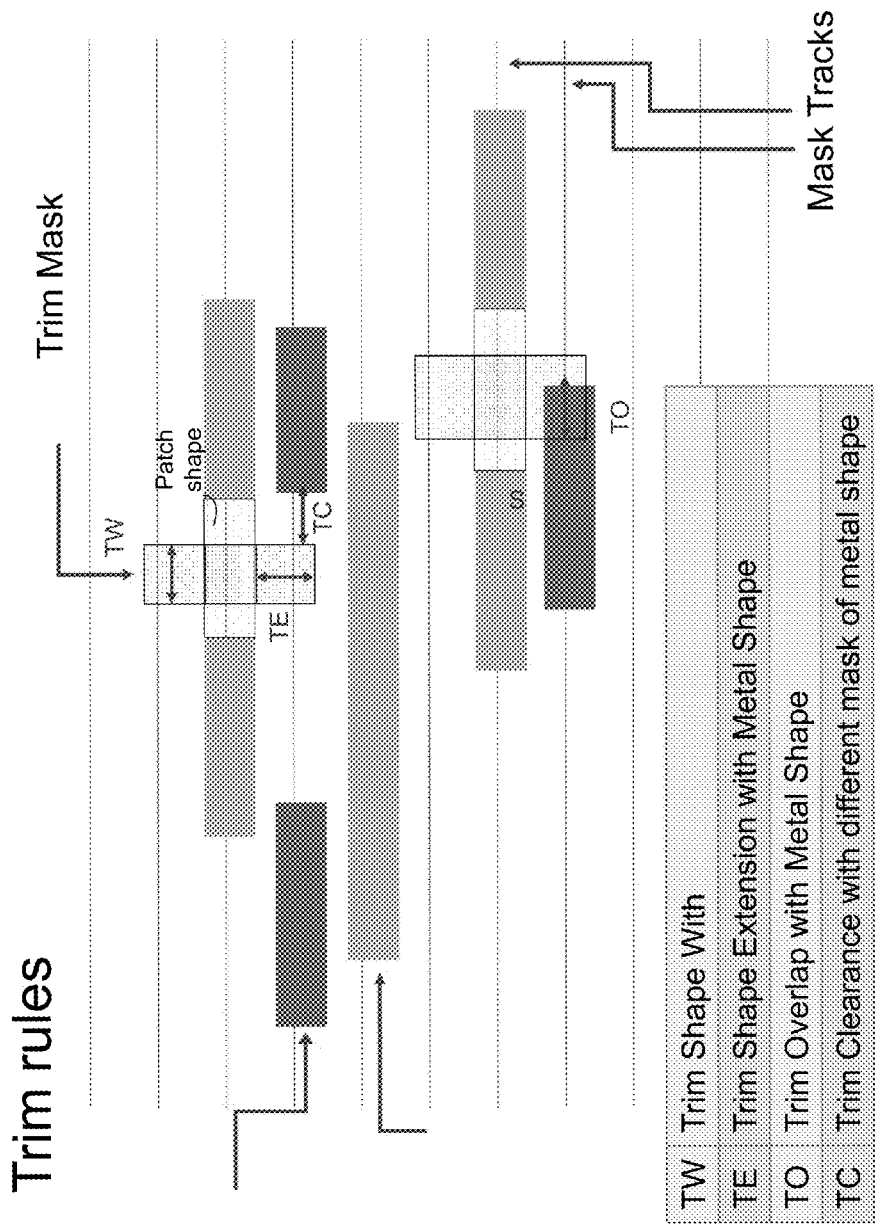
FIG. 11 is a diagram depicting an embodiment incorporating display process in accordance with the present disclosure.

Referring also to FIG. 11, an embodiment of display process 10 showing examples of trim rules that may be employed in accordance with the present disclosure is provided. In some embodiments, the trim rules may be rules that are specified by a foundry or similar group. In this example, "TW" may refer to the trim shape width, "TE" may refer to the trim shape extension with metal shape, "TO" may refer to the trim overlap with metal shape, and "TC" may refer to the trim clearance with different mask of metal shape.

As discussed above, embodiments of display process 10 may be configured to provide an infrastructure and methodology that aims to provide users with a way to visualize cut metal (trim mask) insertion during interactive custom layout designing. Accordingly, during interactive layout designing, display process 10 may determine any line end design rule violations and automatically compute required trim mask shapes in the presence of other neighboring shapes present on same/different tracks and present these to designer on layout canvas. These details may be presented to the designer in a way that is easy for them to understand the line end violations in their entirety, including within the context of the layout. Display process 10 may allow the designer to relate it to the actual constraint and the detailed information from the constraint that came into play causing the violation. Embodiments included herein may also allow the user to resolve a design rule violation by committing a suggested trim mask shape insertion to the design.

In some embodiments, these trim mask shapes may be presented to a user in an easily accessible way. For example, the display may occur in the context of the layout canvas, which may detail all the line end elements in the canvas that cause the violation. Display process 10 may also be configured to provide an optimized trim mask suggestion right at time of wire creation. In contrast with prior techniques, and rather than relying on post processing scripts to insert trim mask shapes, embodiments of display process 10 may provide trim mask shape insertion right at time of basic design elements construction or modification.

Figure 12:
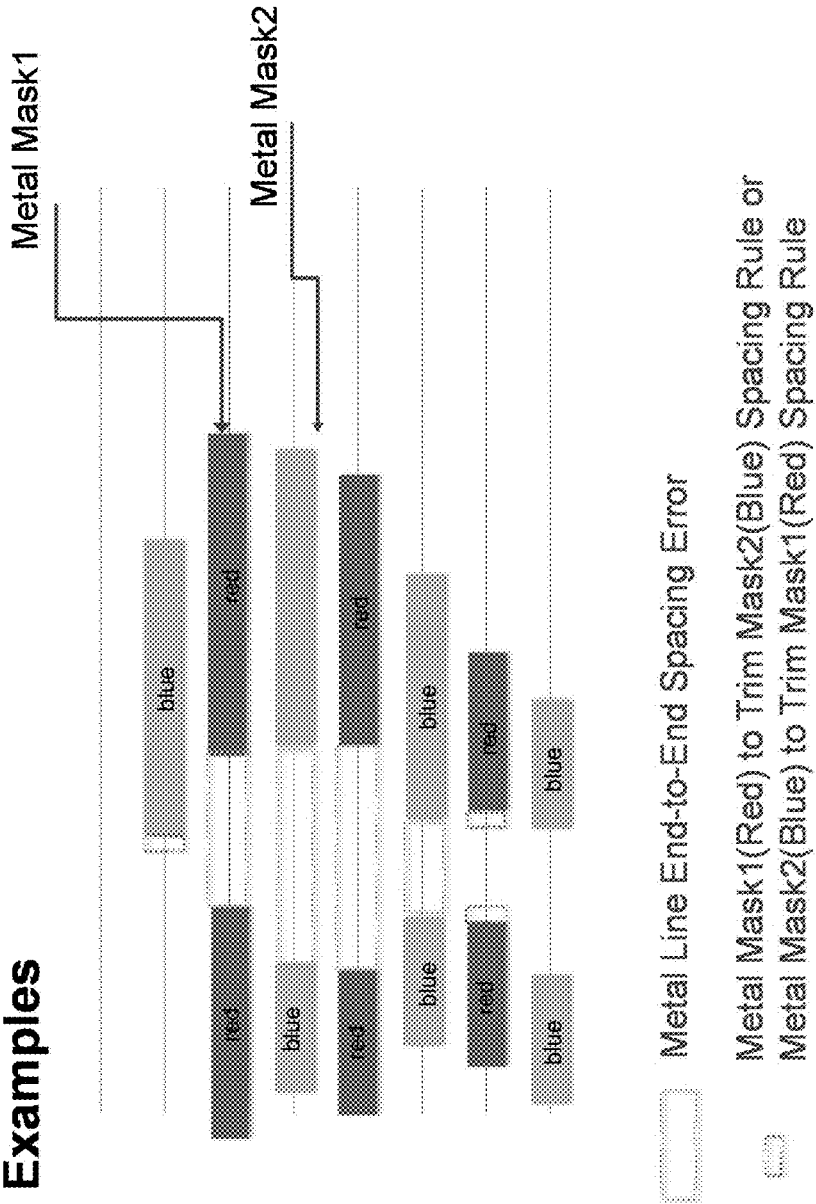
FIG. 12 is a diagram depicting an embodiment incorporating display process in accordance with the present disclosure.
Figure 13:
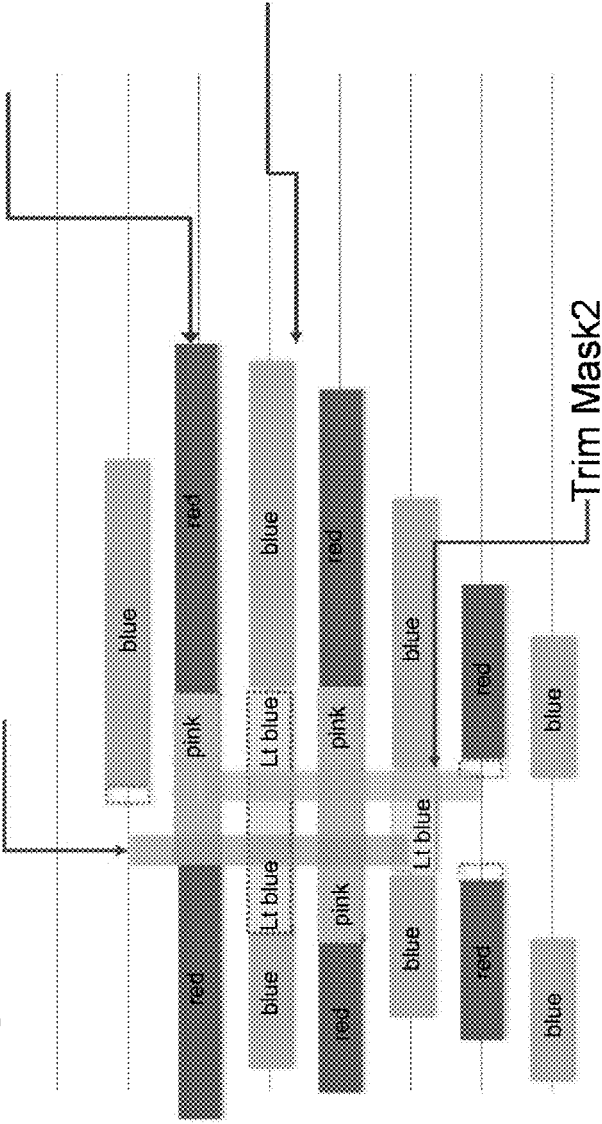
FIG. 13 is a diagram depicting an embodiment incorporating display process in accordance with the present disclosure.

Referring also to FIGS. 12-13, embodiments of display process 10 showing examples of trim rules that may be employed in accordance with the present disclosure are provided. For purposes of explanation, in some embodiments, text has been used to indicate the color of the fill that will be displayed to the user (e.g., blue, red, etc.). In this way, display process 10 may be configured to insert one or more color-coded masks and/or patch shapes as shown.

Figure 14:
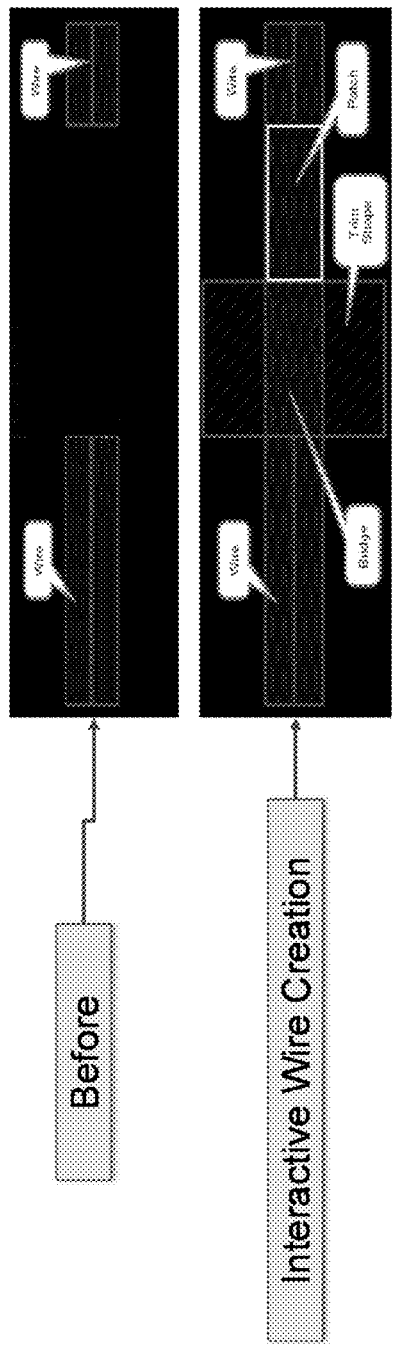
FIG. 14 is a diagram depicting an embodiment incorporating display process in accordance with the present disclosure.

Referring also to FIG. 14, an embodiment of display process 10 showing the visualization of fixing of a line end error during an interactive wire creation operation is provided. In this particular example, the existing wire on the left side of diagram 1400 and the new wire is being created from right side. In operation, as the wire is created interactively from right to left, the designer may be shown examples of trim/bridge/patch shape insertion on layout canvas which may be selected by the designer.

Figure 15:
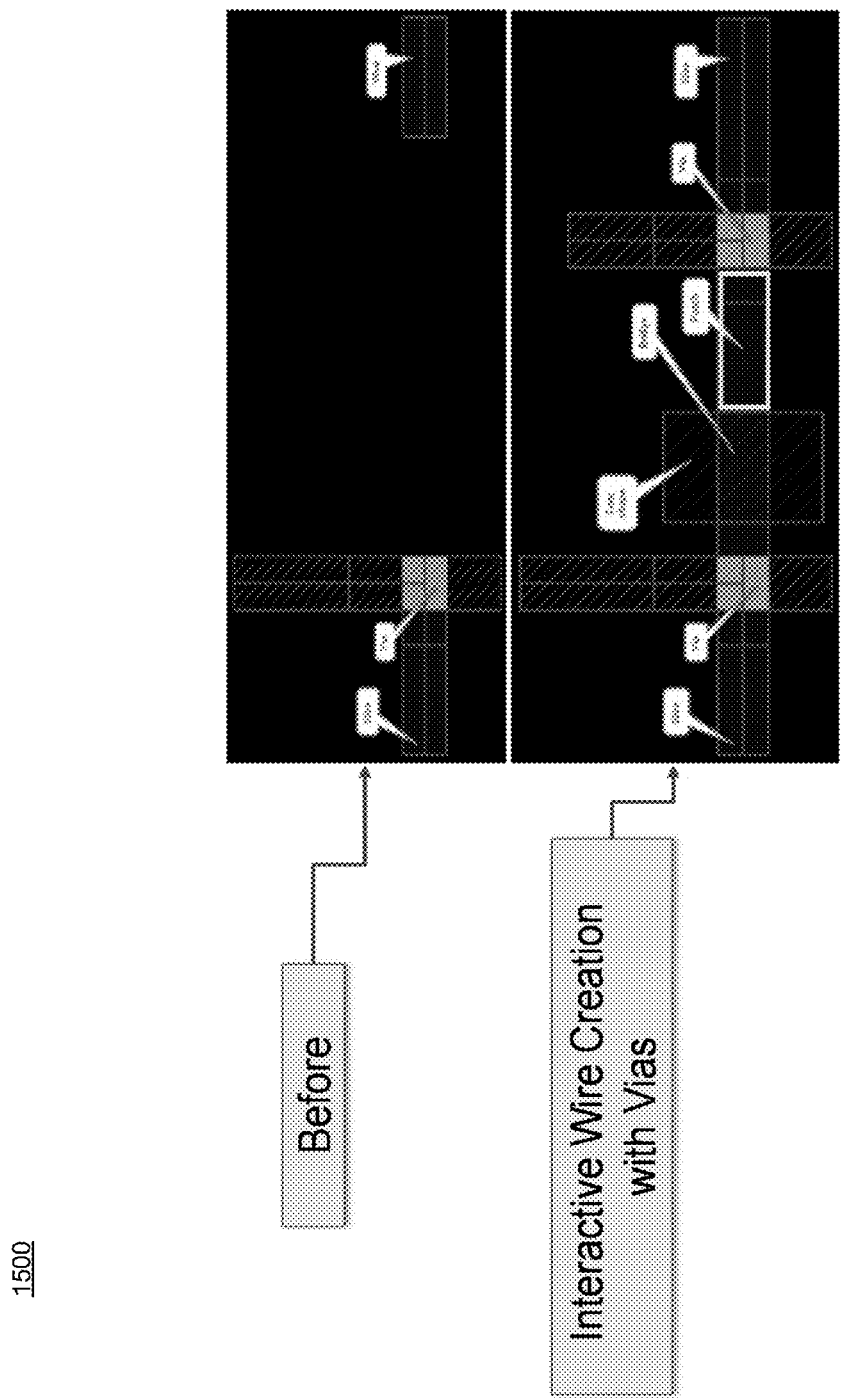
FIG. 15 is a diagram depicting an embodiment incorporating display process in accordance with the present disclosure.

Referring also to FIG. 15, an embodiment of display process 10 showing the visualization of fixing of a line end error during an interactive wire creation with vias operation is provided. In this particular example, a wire with inserted vias already exists (e.g. as shown on the left side of diagram 1500) and a new wire with inserted vias is being created (e.g. as shown on the right side of diagram 1500). In operation, as the wire is created along with vias, trim/bridge/patch shapes may be inserted on the layout canvas, which may be selected by the designer.

Figure 16:
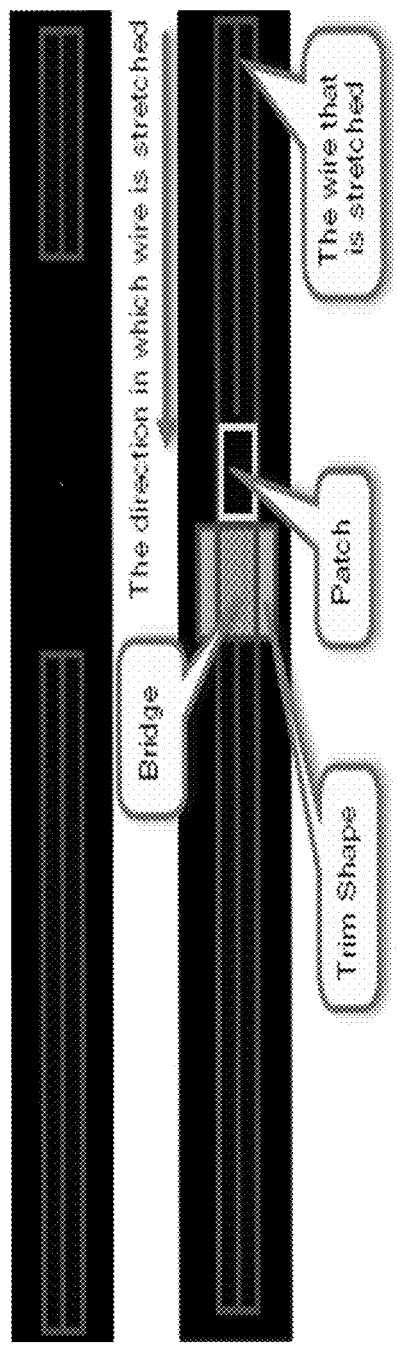
FIG. 16 is a diagram depicting an embodiment incorporating display process in accordance with the present disclosure.

Referring also to FIG. 16, an embodiment of display process 10 showing the visualization of fixing of a line end error during an interactive wire stretch operation is provided.

In this particular example, during a stretch command, the automatic insertion of trim metal layers between two existing wires when one of them is being stretched is shown on canvas. After the new wire is stretched, it may result in the insertion of one or more trim, bridge, and patch shapes which may be selected by the designer.

Figure 17:
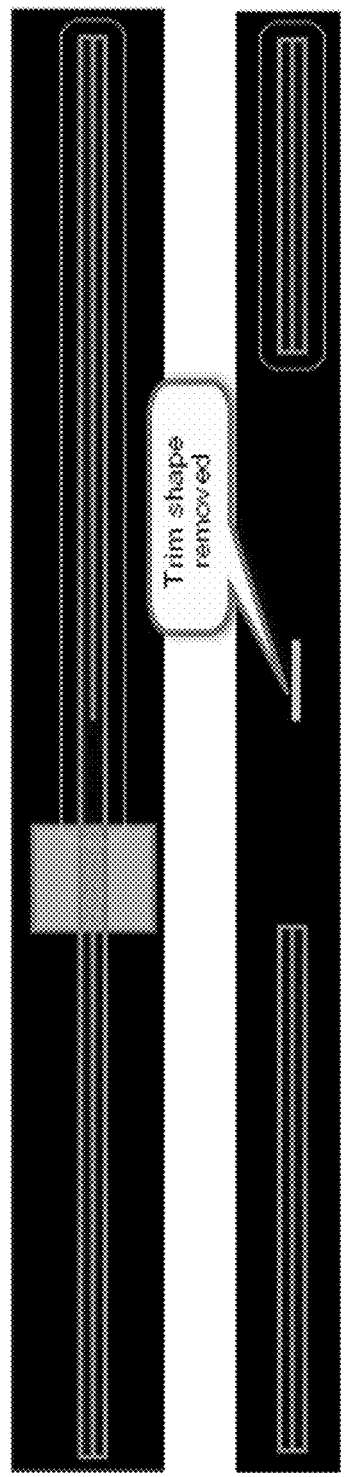
FIG. 17 is a diagram depicting an embodiment incorporating display process in accordance with the present disclosure.

Referring also to FIG. 17, an embodiment of display process 10 showing the visualization of fixing of a line end error during an interactive retract of a stretched wire operation is provided. In this particular example, when a designer retracts the stretched wire, the trim shape may be removed.

Figure 18:
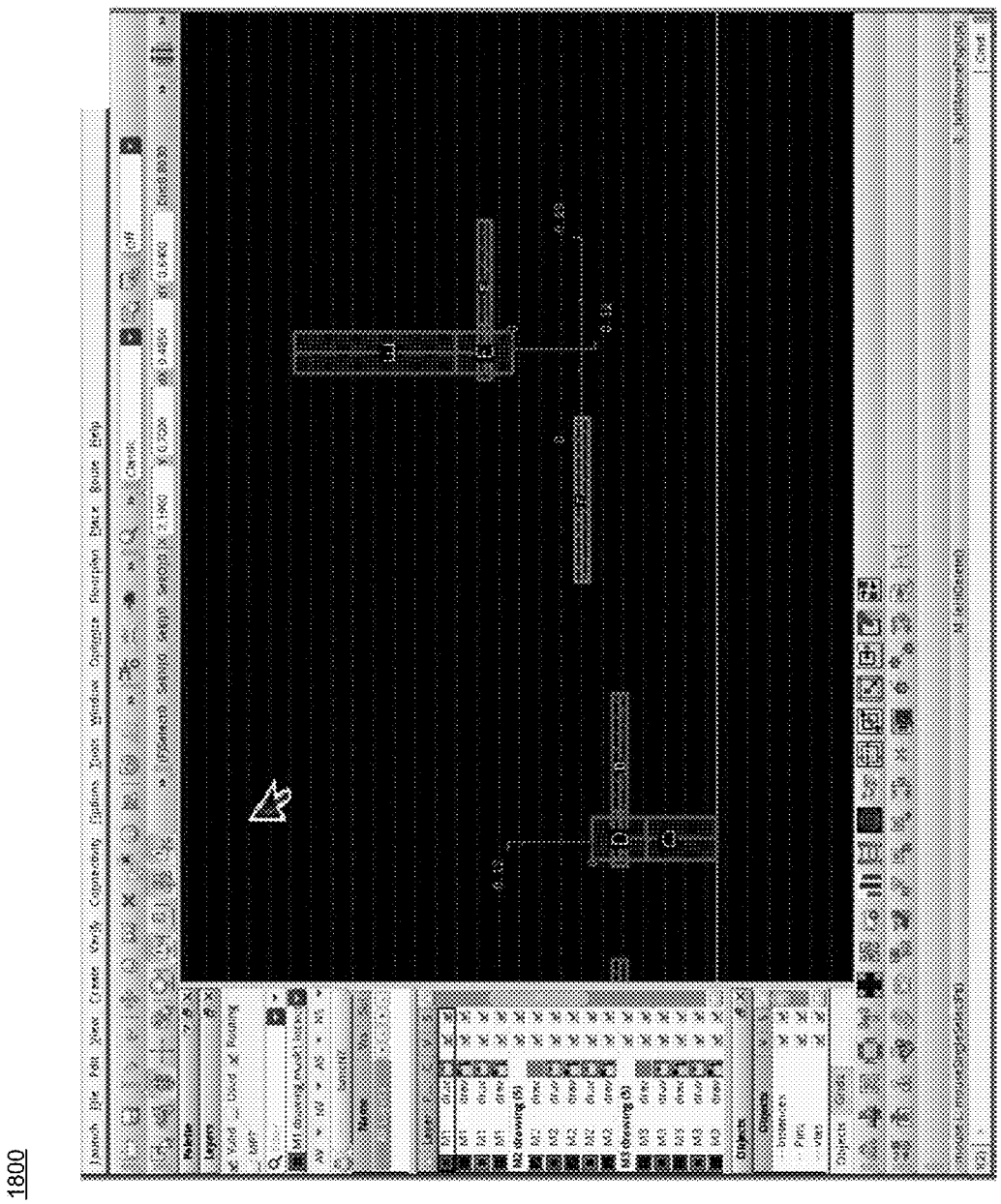
FIG. 18 is a diagram depicting an embodiment incorporating display process in accordance with the present disclosure.
Figure 19:
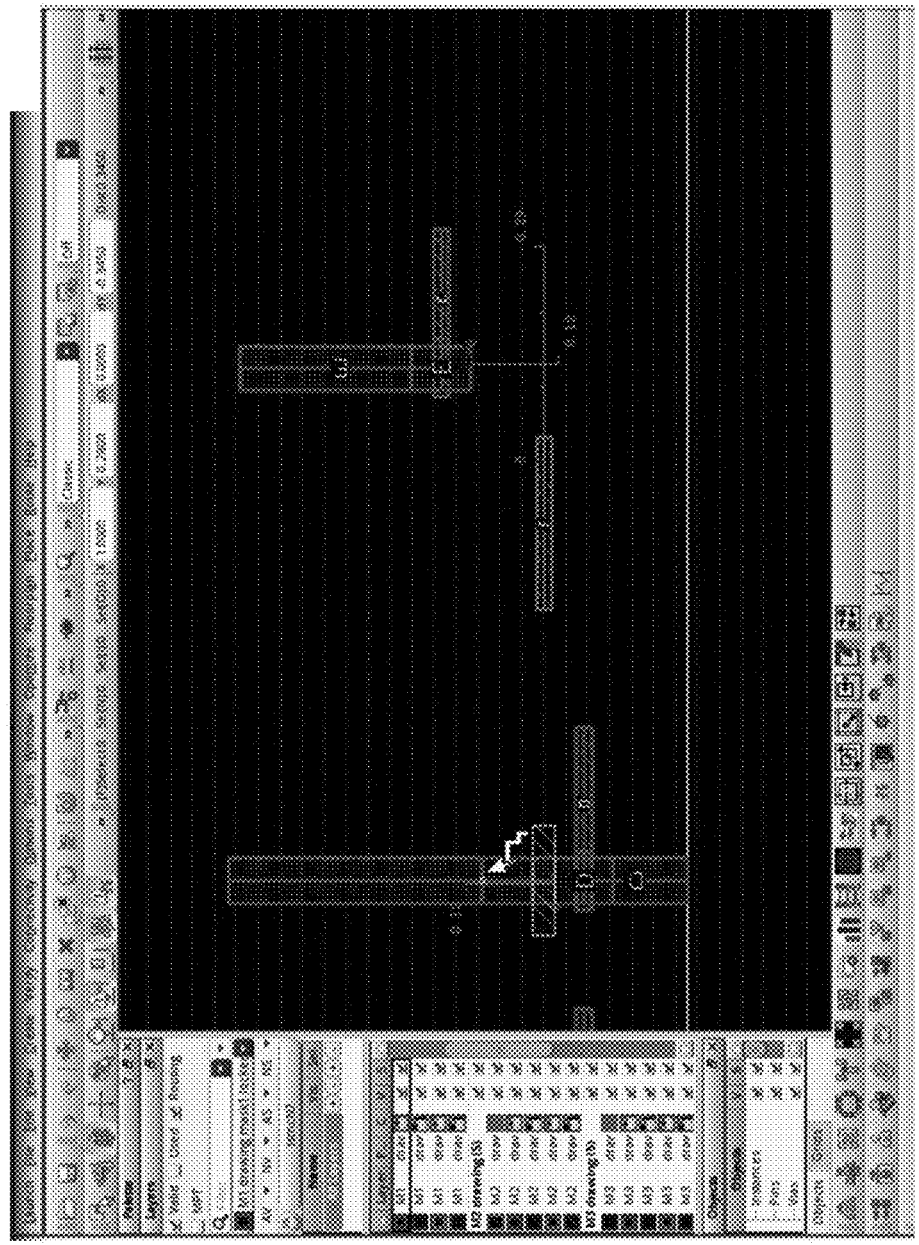
FIG. 19 is a diagram depicting an embodiment incorporating display process in accordance with the present disclosure.
Figure 20:
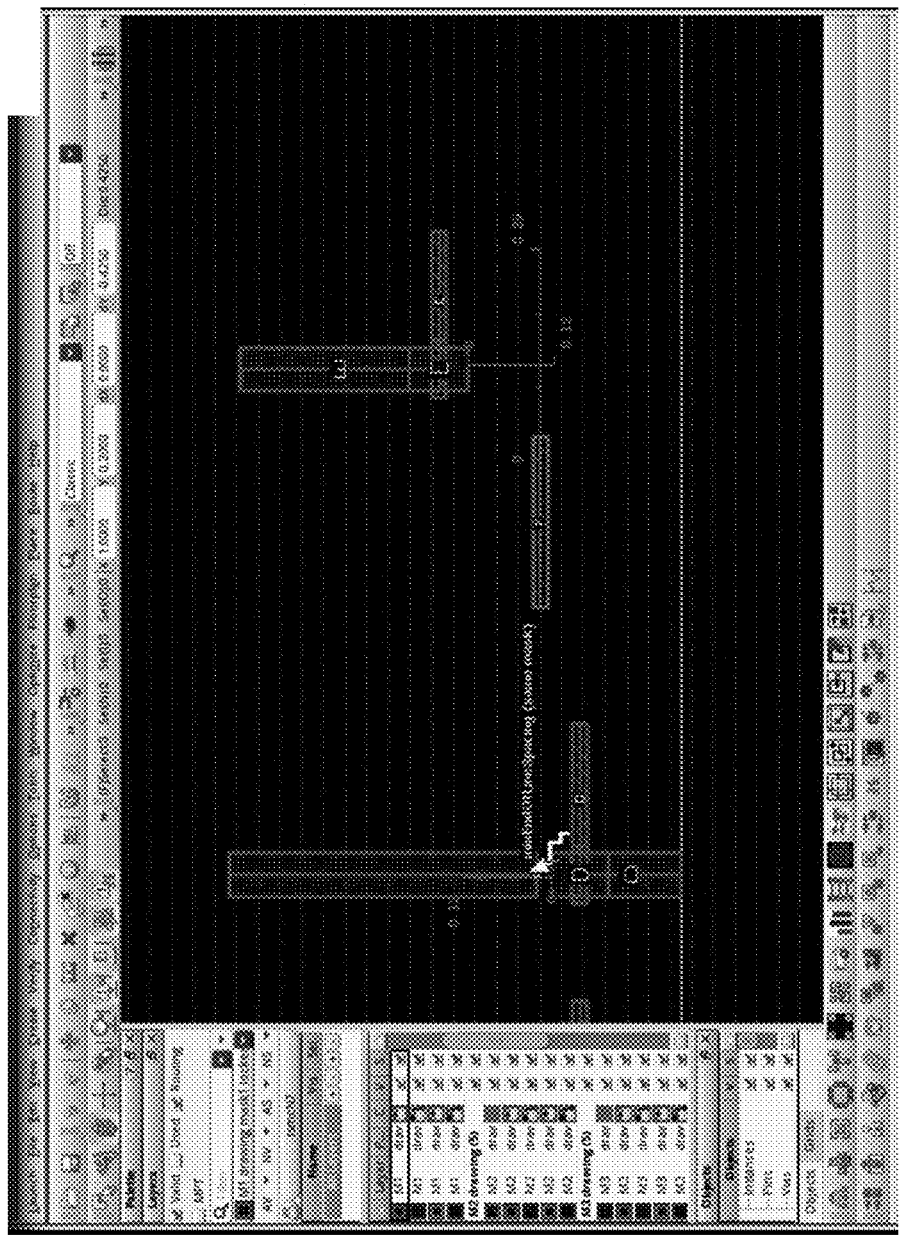
FIG. 20 is a diagram depicting an embodiment incorporating display process in accordance with the present disclosure.
Figure 21:
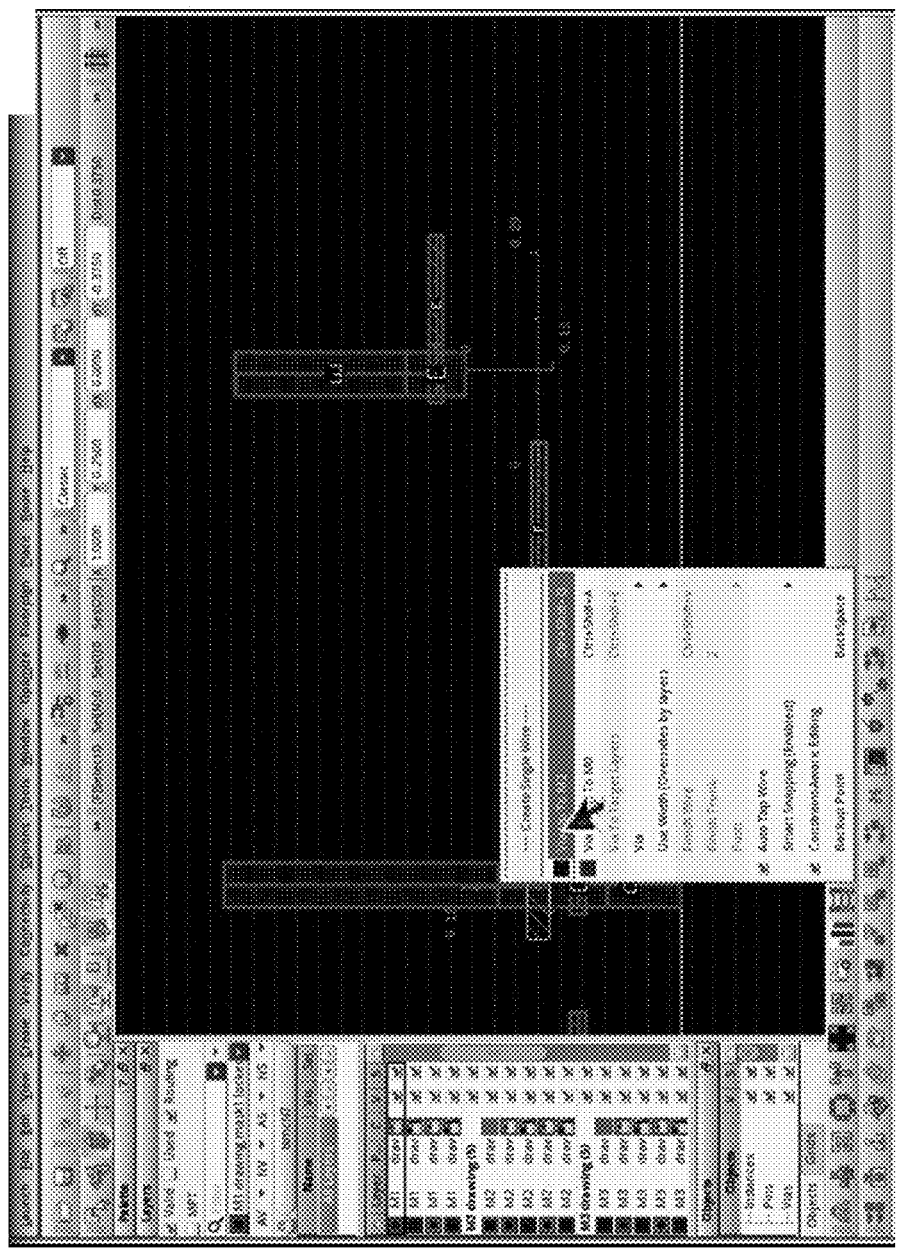
FIG. 21 is a diagram depicting an embodiment incorporating display process in accordance with the present disclosure.
Figure 22:
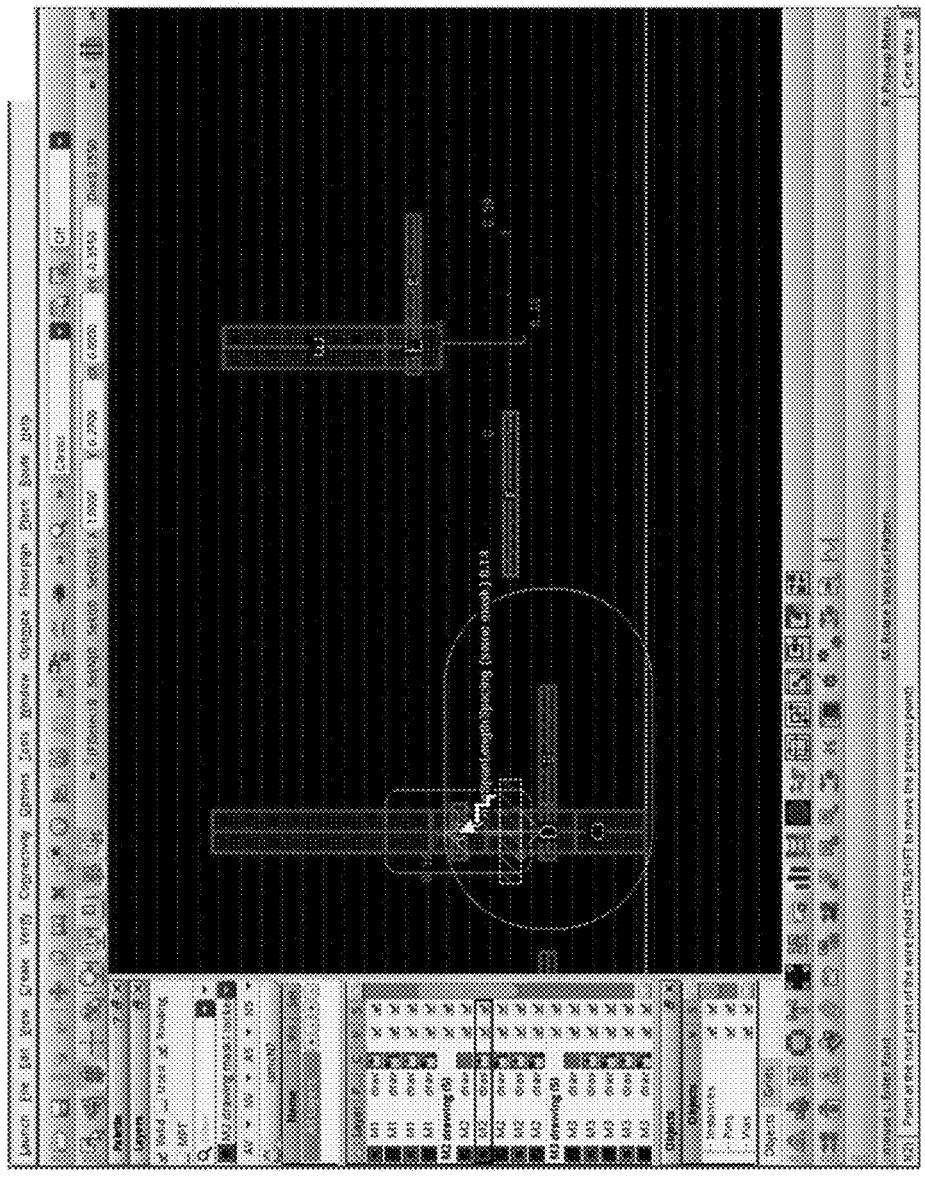
FIG. 22 is a diagram depicting an embodiment incorporating display process in accordance with the present disclosure.
Figure 23:
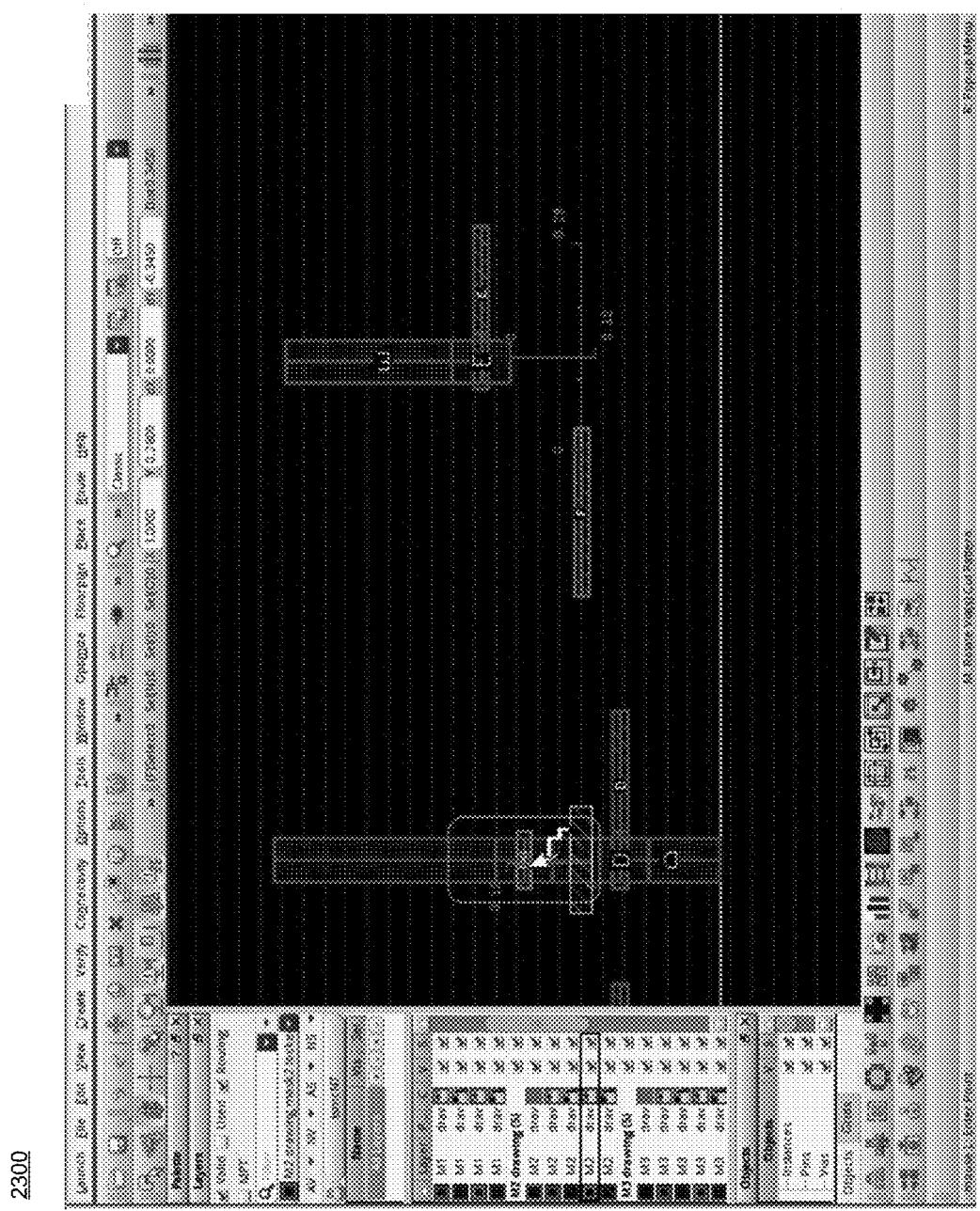
FIG. 23 is a diagram depicting an embodiment incorporating display process in accordance with the present disclosure.
Figure 24:
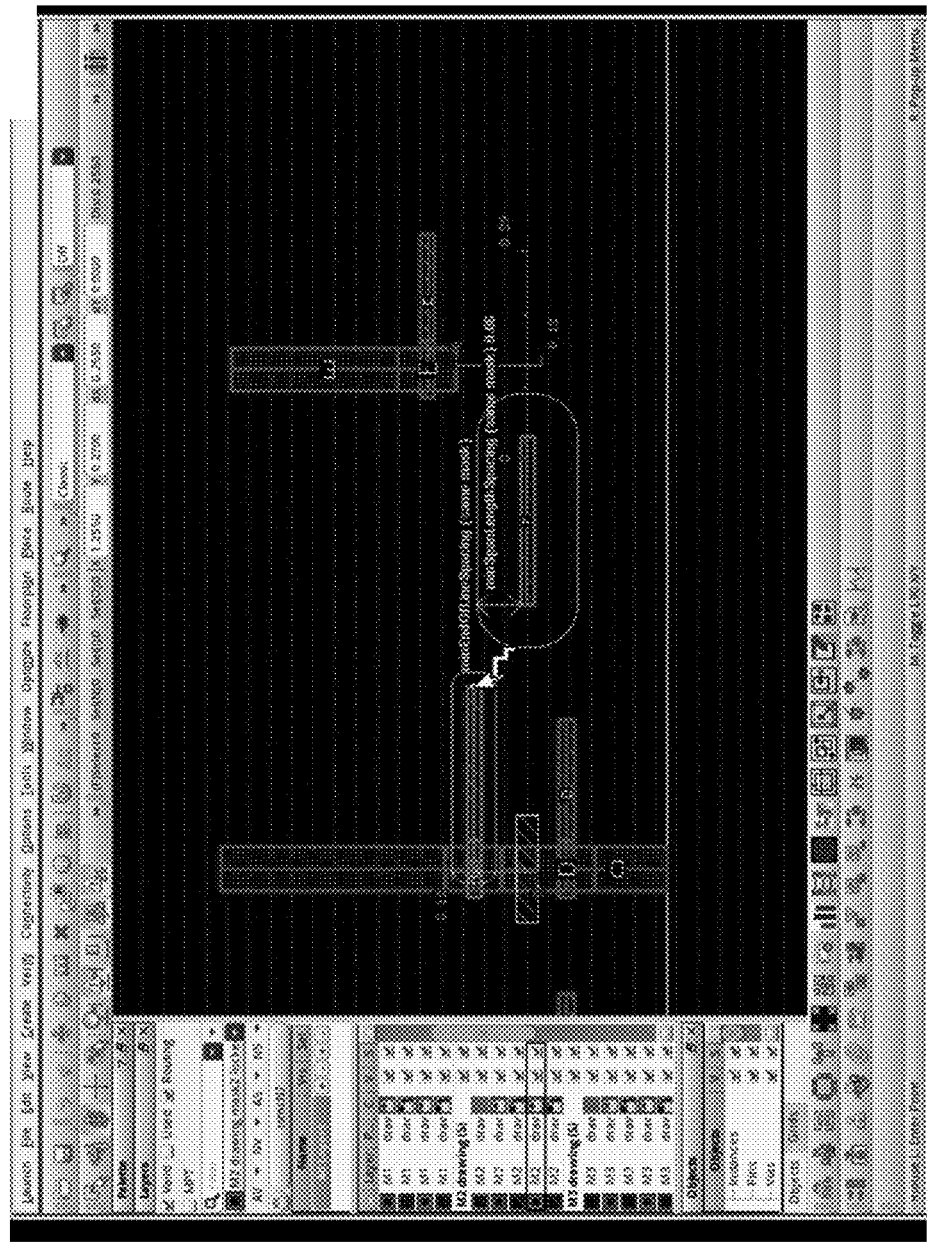
FIG. 24 is a diagram depicting an embodiment incorporating display process in accordance with the present disclosure.
Figure 25:
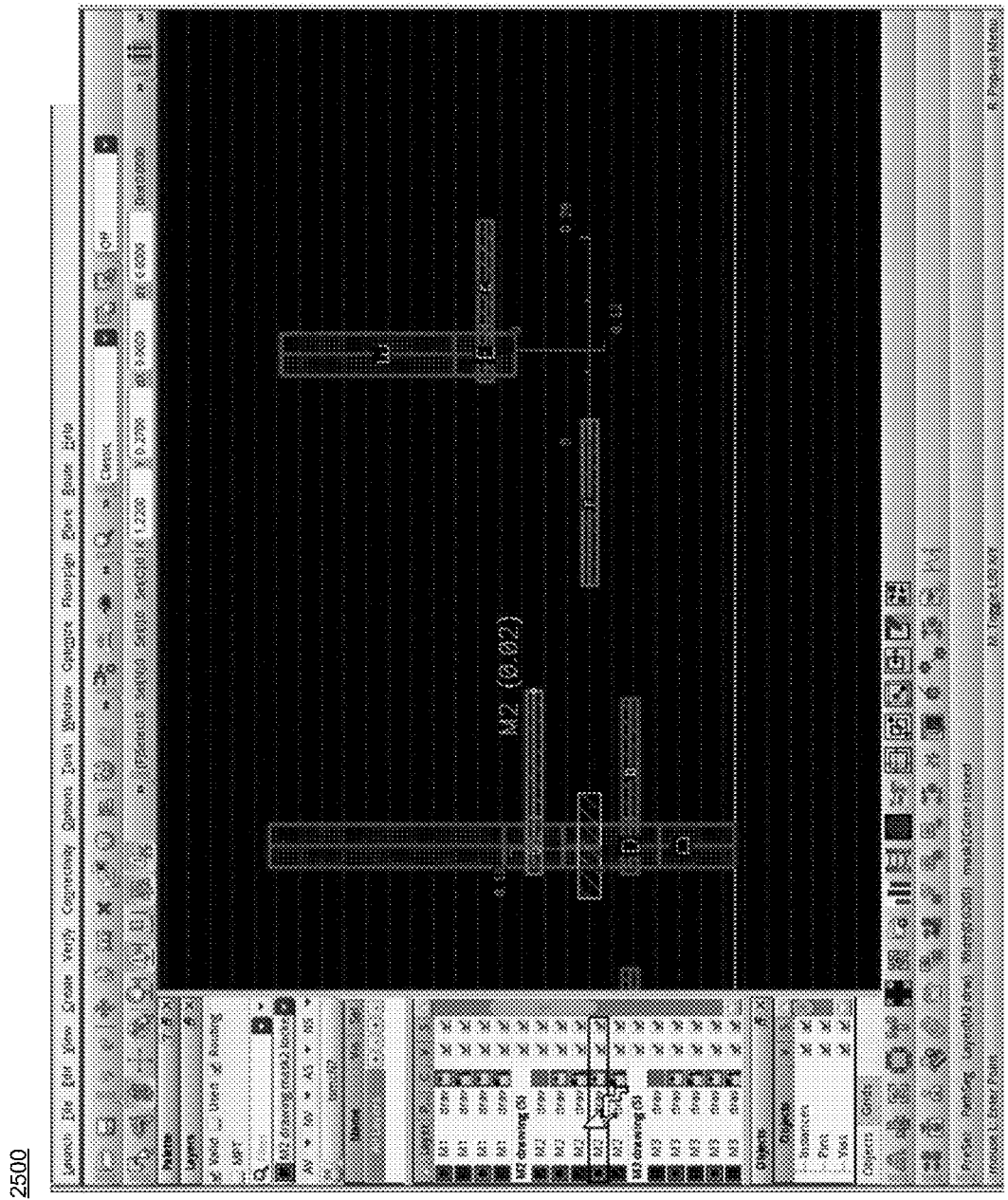
FIG. 25 is a diagram depicting an embodiment incorporating display process in accordance with the present disclosure.
Figure 26:
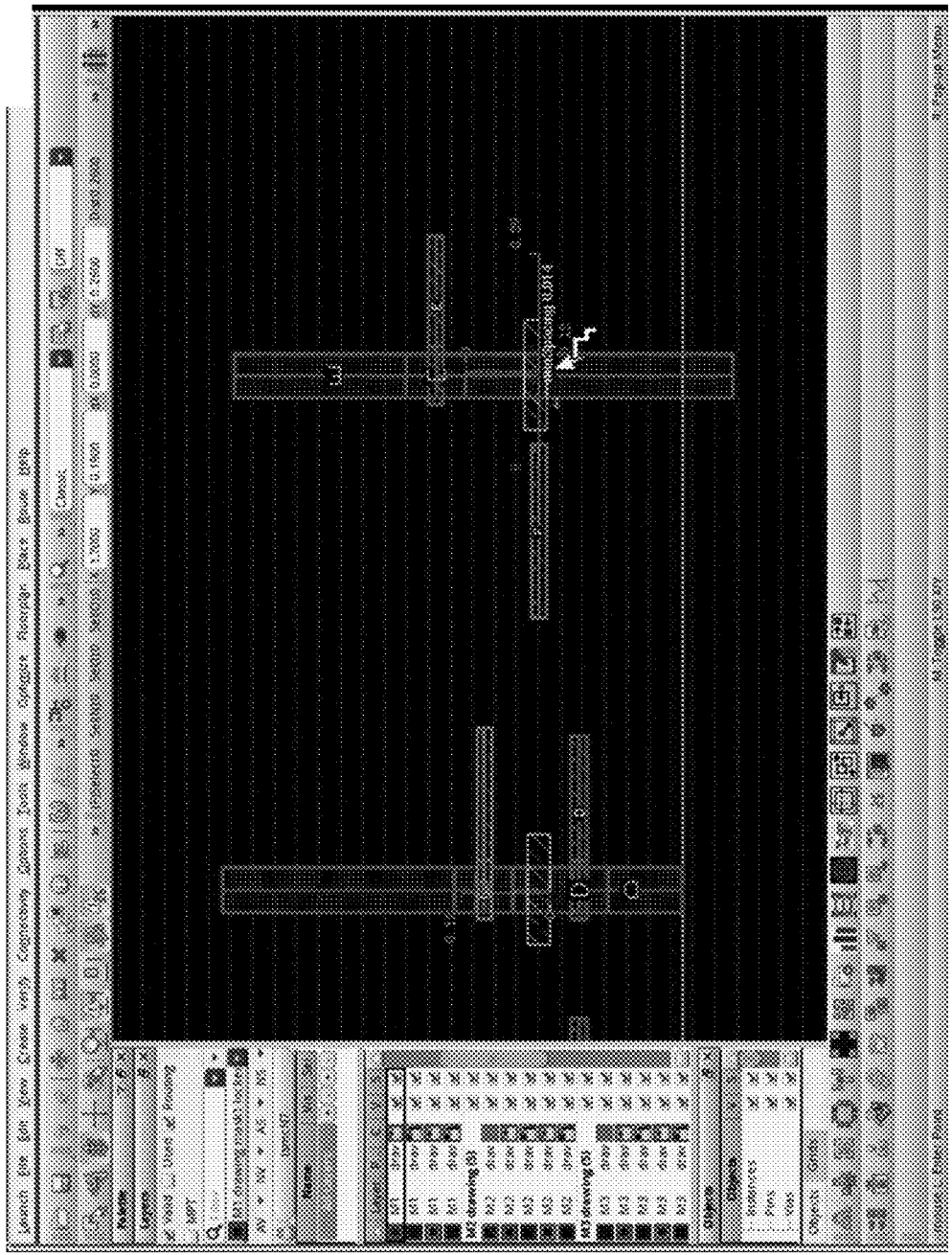
FIG. 26 is a diagram depicting an embodiment incorporating display process in accordance with the present disclosure.
Figure 27:
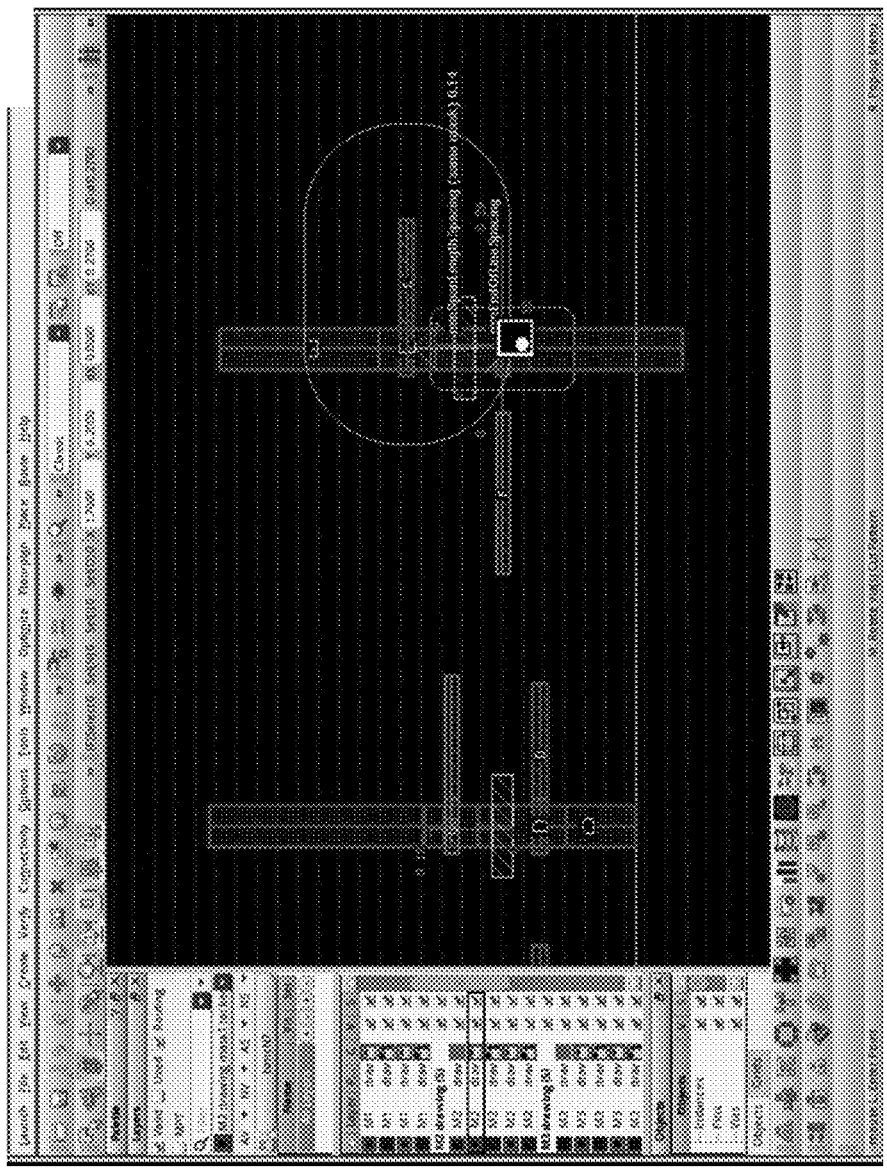
FIG. 27 is a diagram depicting an embodiment incorporating display process in accordance with the present disclosure.
Figure 28:
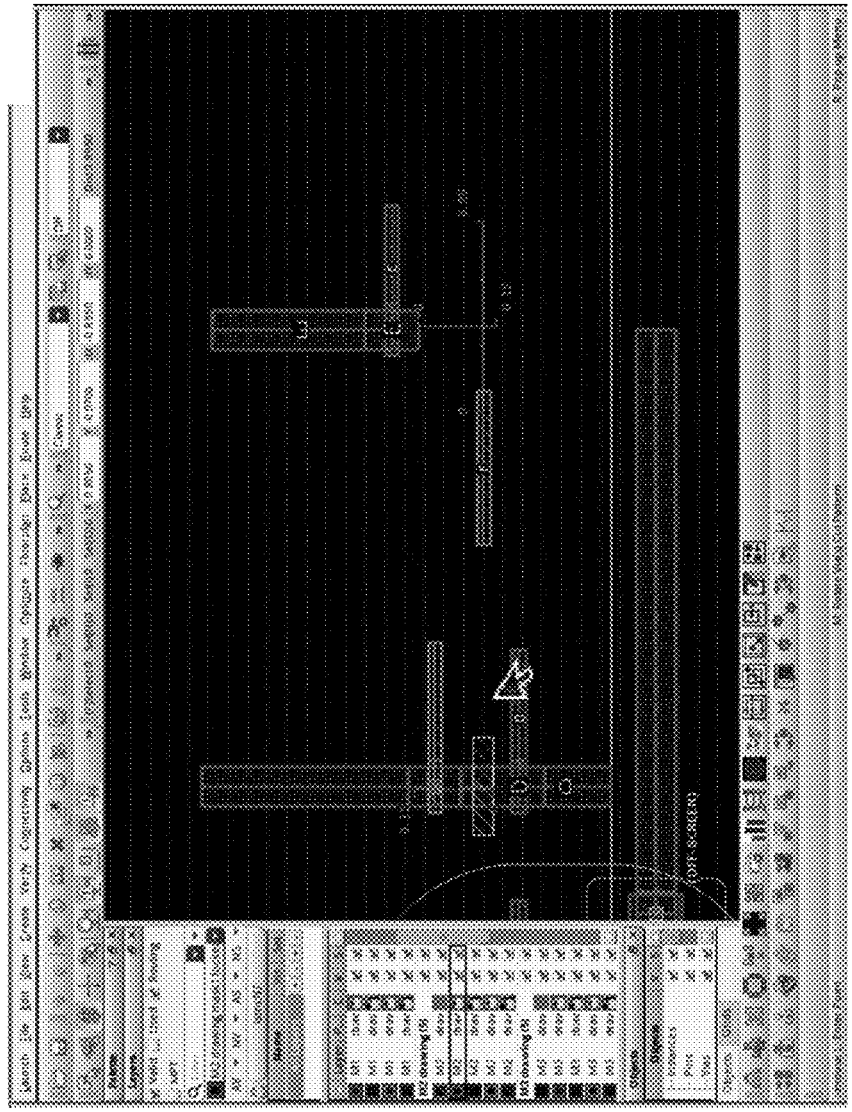
FIG. 28 is a diagram depicting an embodiment incorporating display process in accordance with the present disclosure.
Figure 29:
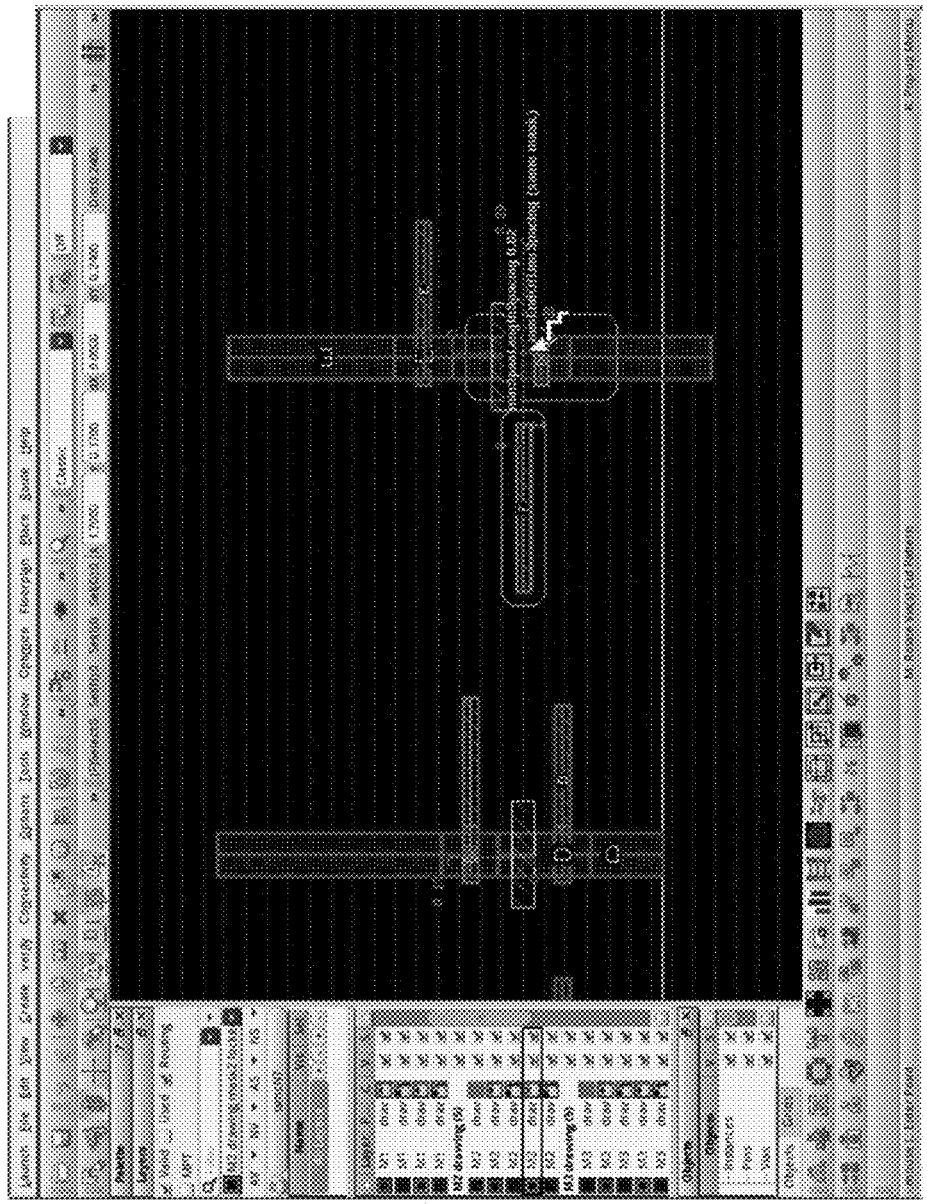
FIG. 29 is a diagram depicting an embodiment incorporating display process in accordance with the present disclosure.
Figure 30:
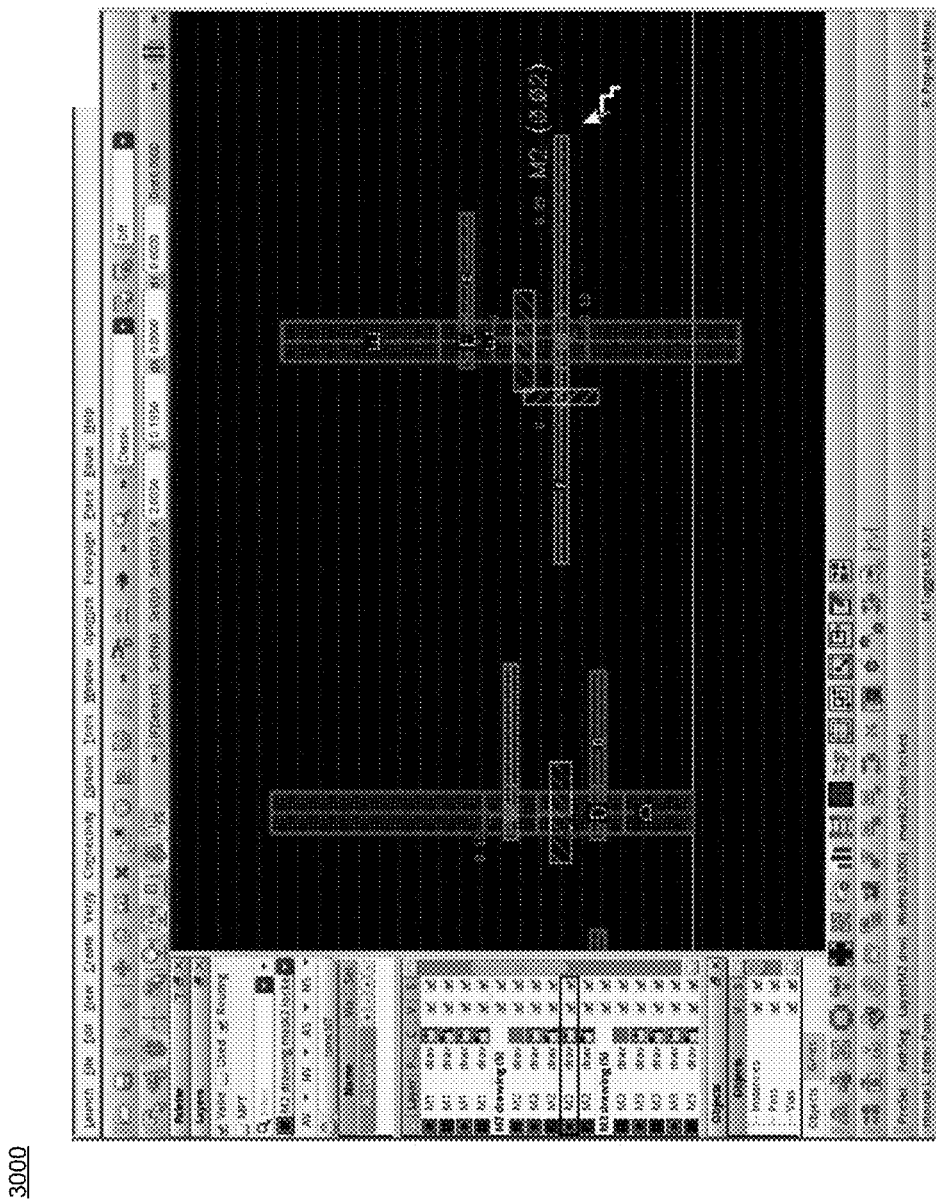
FIG. 30 is a diagram depicting an embodiment incorporating display process in accordance with the present disclosure.
Figure 31:
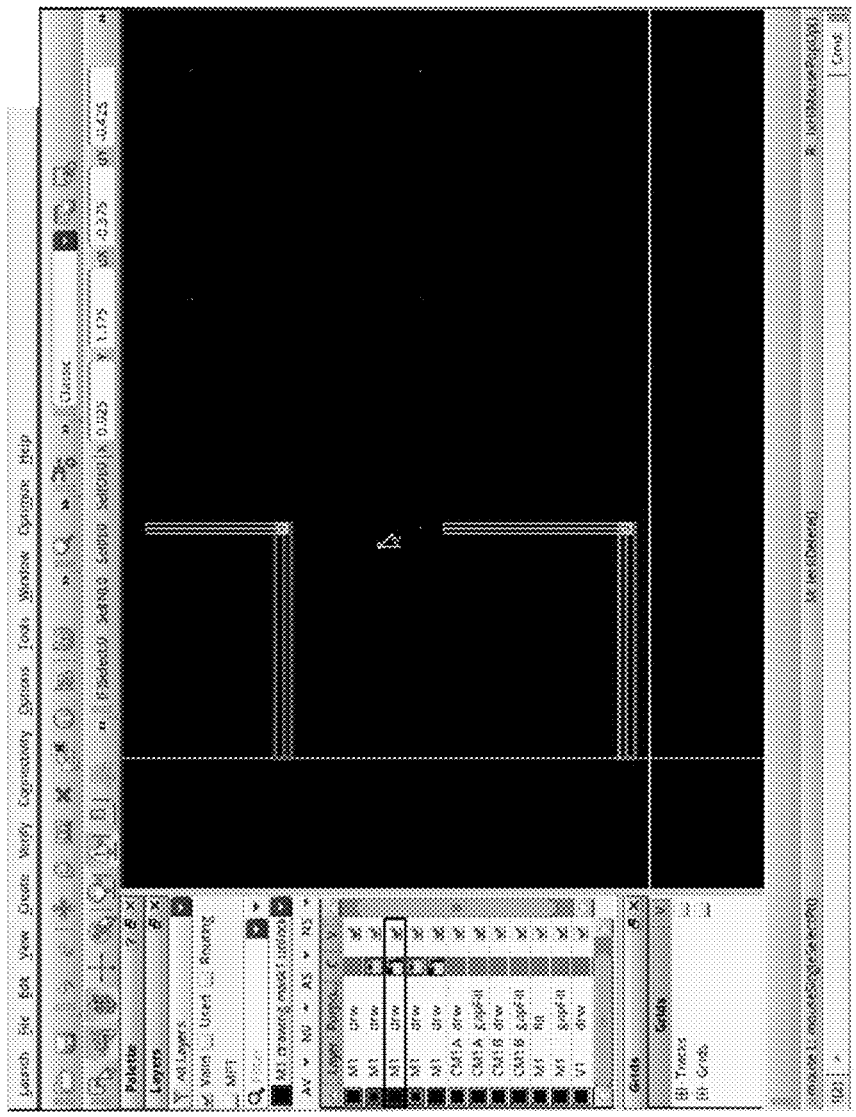
FIG. 31 is a diagram depicting an embodiment incorporating display process in accordance with the present disclosure.
Figure 32:
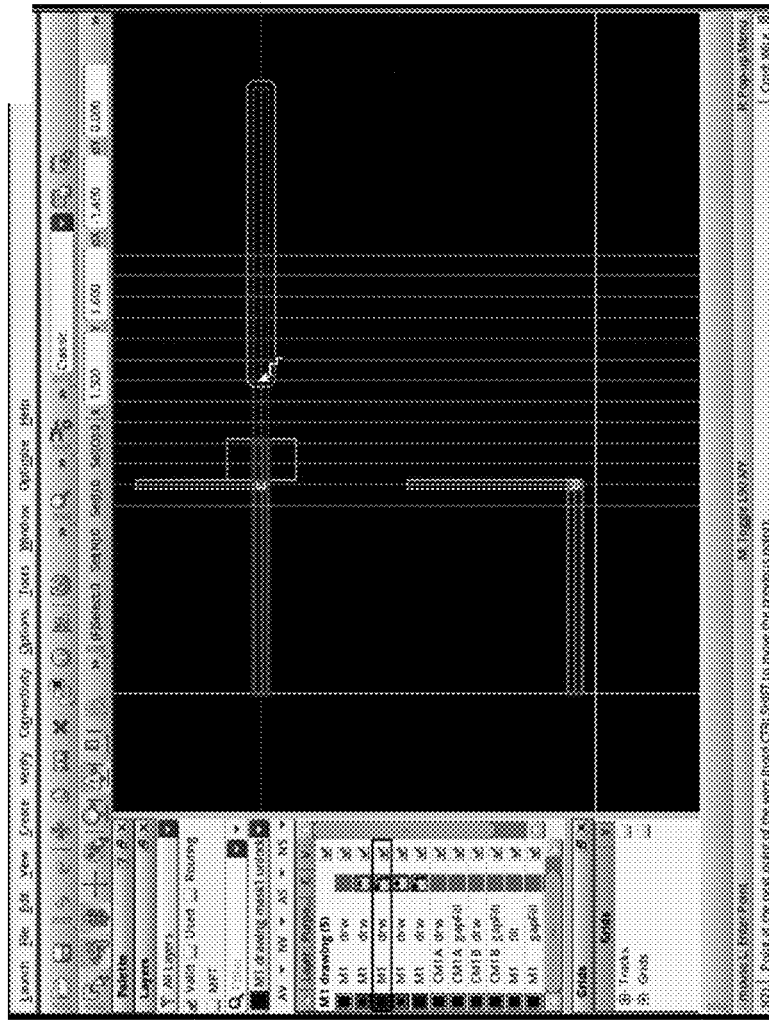
FIG. 32 is a diagram depicting an embodiment incorporating display process in accordance with the present disclosure.
Figure 33:
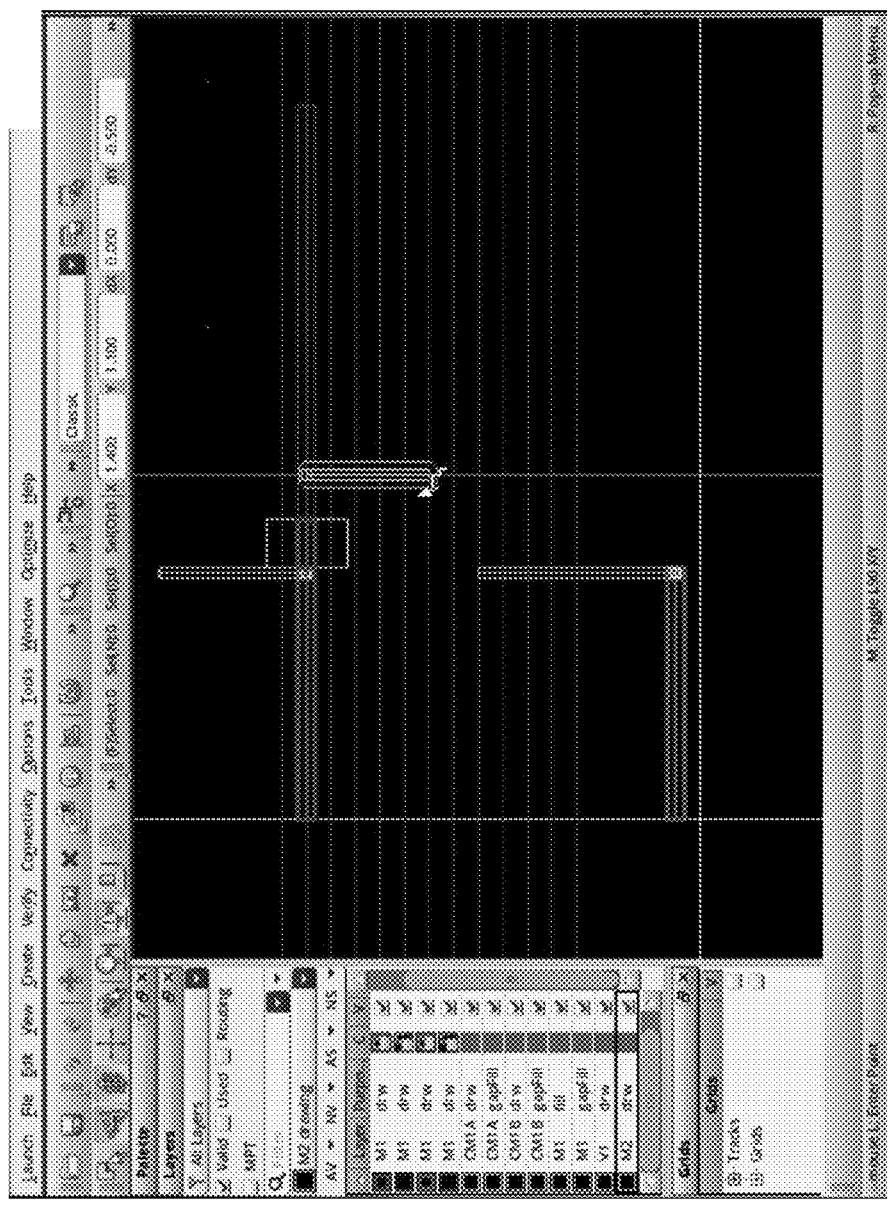
FIG. 33 is a diagram depicting an embodiment incorporating display process in accordance with the present disclosure.
Figure 34:
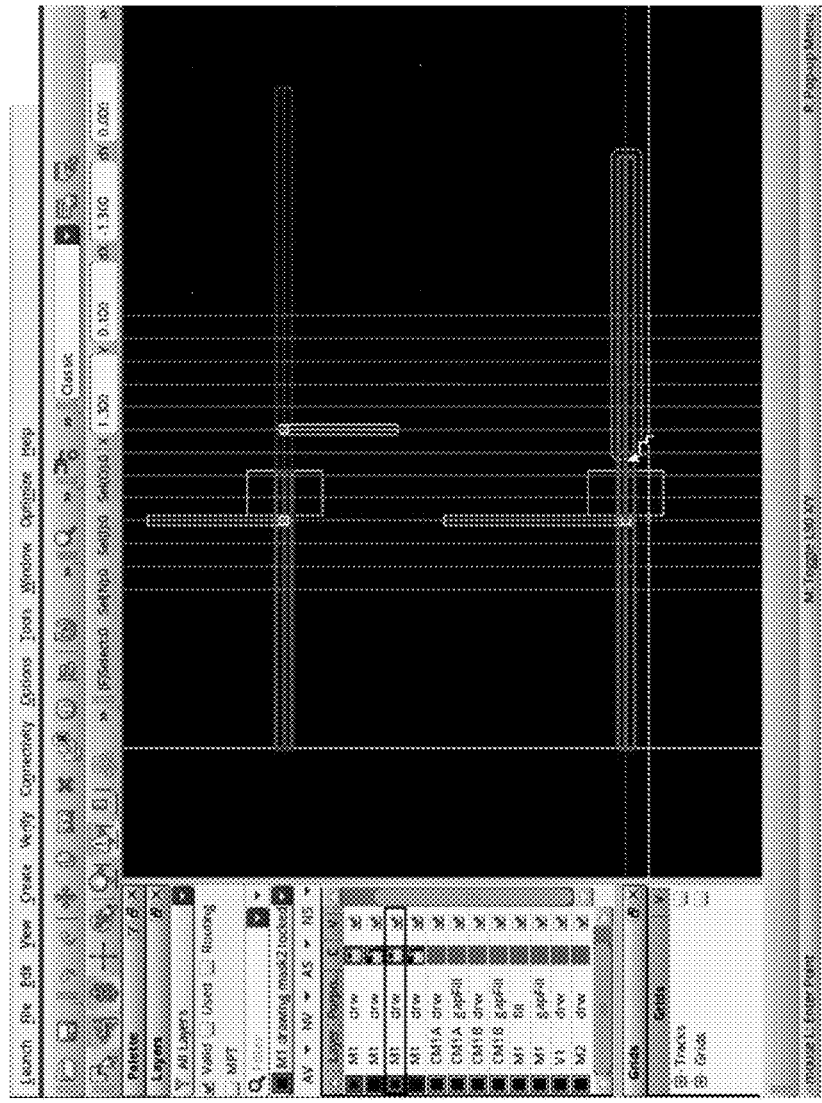
FIG. 34 is a diagram depicting an embodiment incorporating display process in accordance with the present disclosure.
Figure 35:
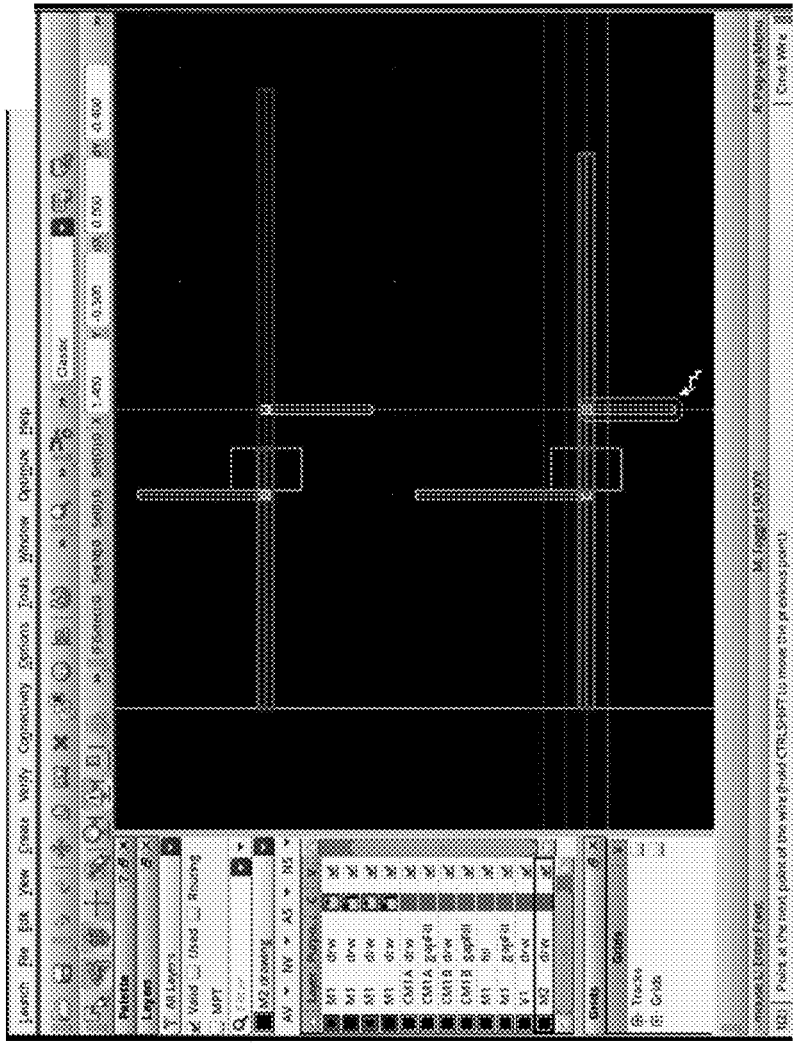
FIG. 35 is a diagram depicting an embodiment incorporating display process in accordance with the present disclosure.
Figure 36:
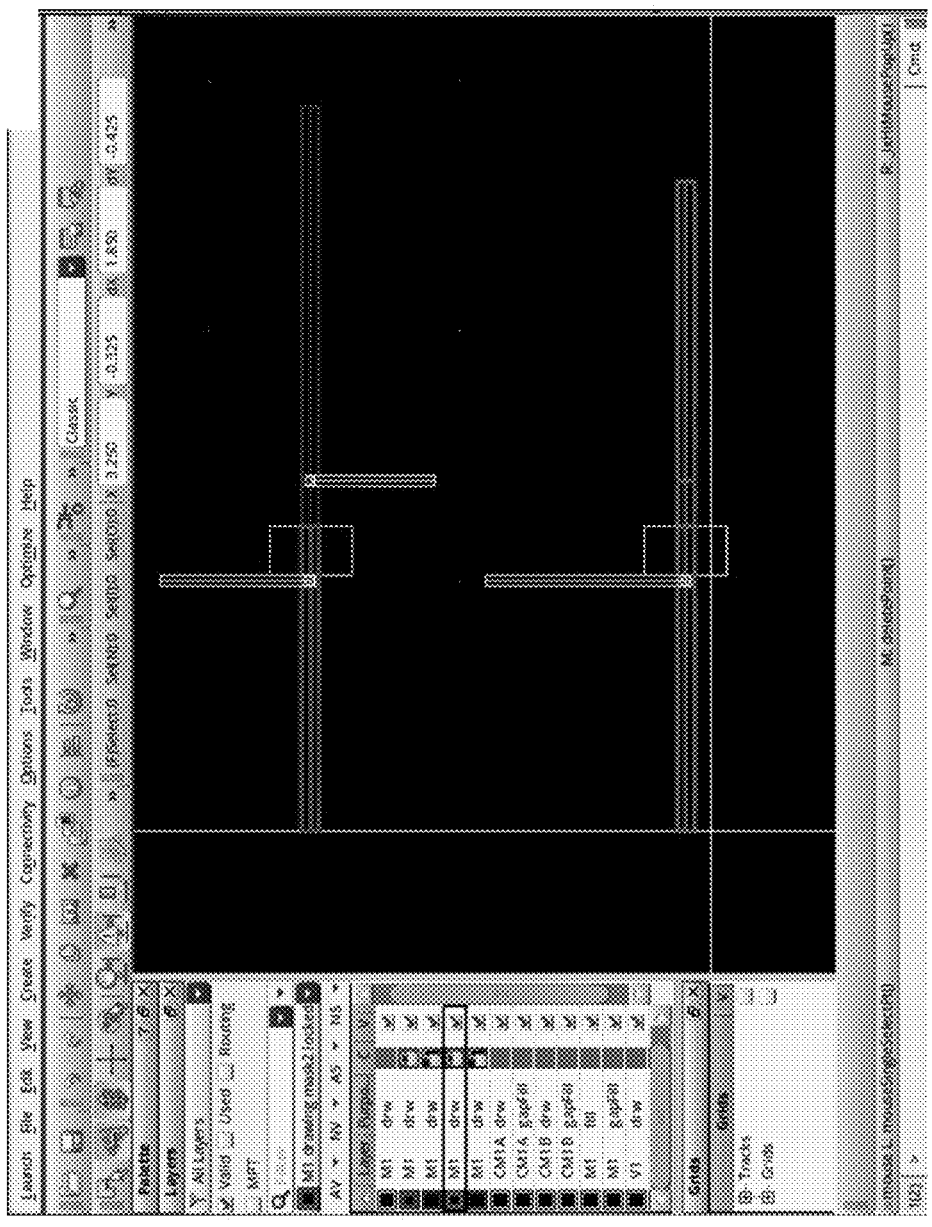
FIG. 36 is a diagram depicting an embodiment incorporating display process in accordance with the present disclosure.

Referring also to FIGS. 18-30, embodiments of display process 10 showing the visualization of fixing of a line end error during an interactive wire creation operation is provided. FIG. 18 depicts an example of an "Interactive Wire Creation" Use Model (similar to FIG. 14). As is shown at the bottom of the Figure, a few shapes already exist in the electronic design (these are referred to as static shapes) and a new wire may be interactively created using any suitable approach (e.g., a mouse pointer location, etc.) referred to as dynamic shape. FIG. 19 depicts an example where, as a wire is interactively created and moved near existing static line ends, and if the space is less than a pre-defined line-end constraint value, the cut-metal insertion engine may be configured to insert one or more trim, bridge, and/or patch shapes. FIG. 21 shows an example of an "Interactive Wire Creation with Vias" use model (similar to FIG. 15). As is shown at the bottom of the Figure, a few shapes already exist in the electronic design, which are referred to as static shapes (in this example it includes bottom shapes, newly created wire and TRIM/BRIDGE/PATCH shapes which may have been committed to as part of FIG. 19). In FIG. 21, the user may intend to take the wire to another metal layer using a VIA. FIG. 22 shows an example where a user is placing a VIA at an appropriate location on Metal M1. After placing the VIA on Metal M1, FIG. 23 depicts an example where the user is performing a create wire operation on Metal M2. FIG. 24 depicts an example where the user is creating a wire on Metal M2 and Metal M2 related violations are being shown on the canvas as the user interactively changes wire length. In FIG. 25, the user has finally committed to the wire creation on Metal M2. FIG. 26 depicts an example similar to FIG. 18 described above. FIG. 27 depicts an example presenting different aspects of TRIM/PATCH/BRIDGE insertion with different metal layers, which also involves VIAs.

Referring also to FIGS. 31-36, embodiments of display process 10 showing the visualization of fixing of a line end error during a tracks operation is provided. These examples are similar to above explained user models for "Interactive Wire Creation" & "Interactive Wire Creation with Vias" with involvement of layout tracks of Self Align Double Patterning.

Referring also to FIGS. 37-55, embodiments of display process 10 showing methods for calculating and visualizing design rule check ("DRC") clean trim areas is provided. Embodiments included herein may enable user assisted trim placement flow in mask-layout designing. For certain advanced nodes technology nodes, such as the Self Align Double Patterning manufacturing process described above, there are numerous requirements. For example, it is often a requirement that any gaps between line ends of two signal carrying metal shapes have a valid trim shape to split the signal yet allow it to be capable of manufacture. However, these trim shapes do have various spacing constraints between them, for example, one common constraint is the trim to trim spacing constraint. Embodiments of display process 10 may include an automatic fixing tool that may be configured to insert trim shapes to minimize the number of trim spacing violations. This may help to achieve a quick design closure.

Embodiments of display process 10 may include an interactive trim fixer, which with minimal user action, may be configured to insert trim interactively and provide immediate feedback about trim spacing violations and placement status. In some embodiments, the interactive trim fixer may be configured to highlight all valid trim areas in the layout region where trims may be inserted without violating any other existing geometry. In operation, a user may select any valid area and the tool may be configured to insert a valid trim shape. In response, the adjacent affected valid trim areas may be updated in real-time. If the update is undesirable, the user may undo and attempt a different strategy to fix the trim violations.

Figure 37:
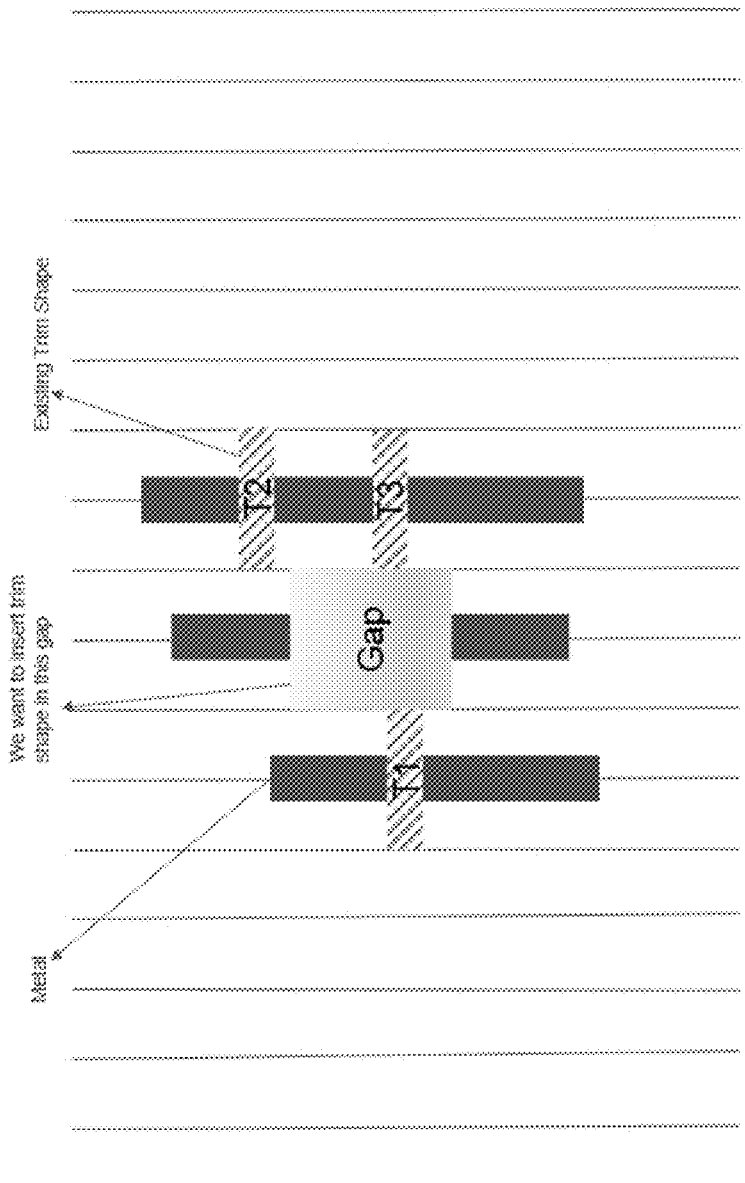
FIG. 37 is a diagram depicting an embodiment incorporating display process in accordance with the present disclosure.

Referring also to FIG. 37, an example is provided where some trims already exist. In this particular example, the user may want to insert trim in the gap so that no violation occurs with any of the adjoining trim. More specifically, trims T1, T2, and T3 already exist and the goal is to understand the valid trim location in the Gap between metal ends.

Figure 38:
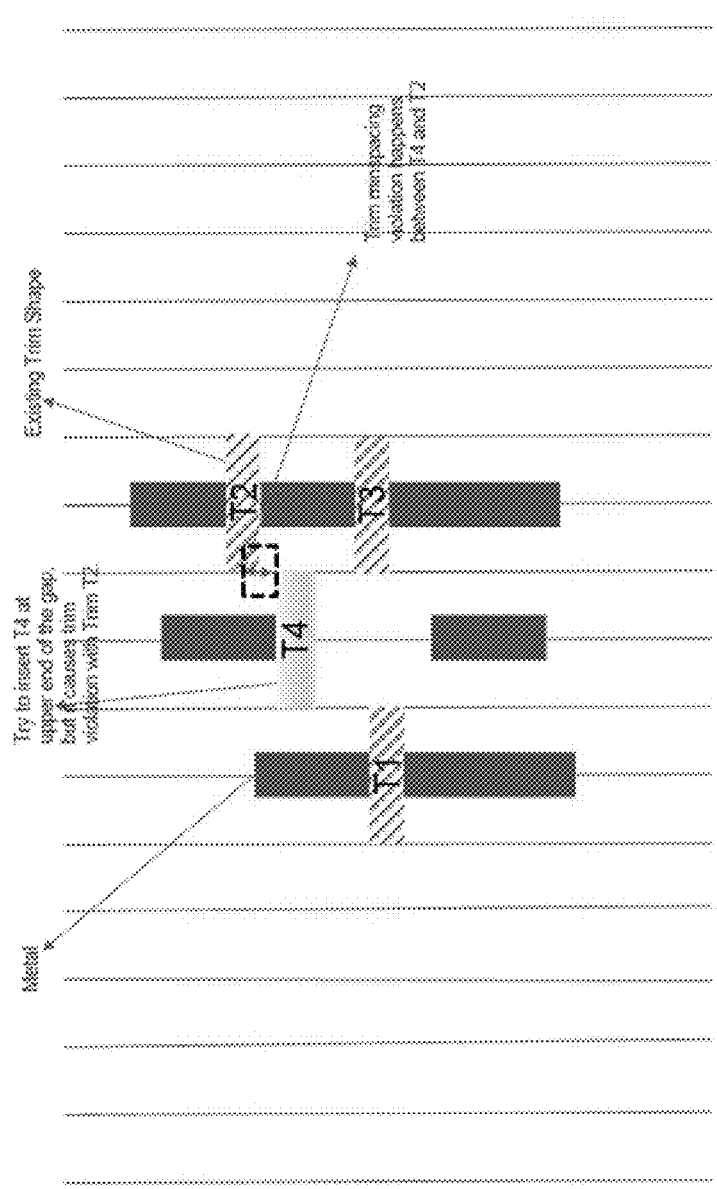
FIG. 38 is a diagram depicting an embodiment incorporating display process in accordance with the present disclosure.
Figure 39:
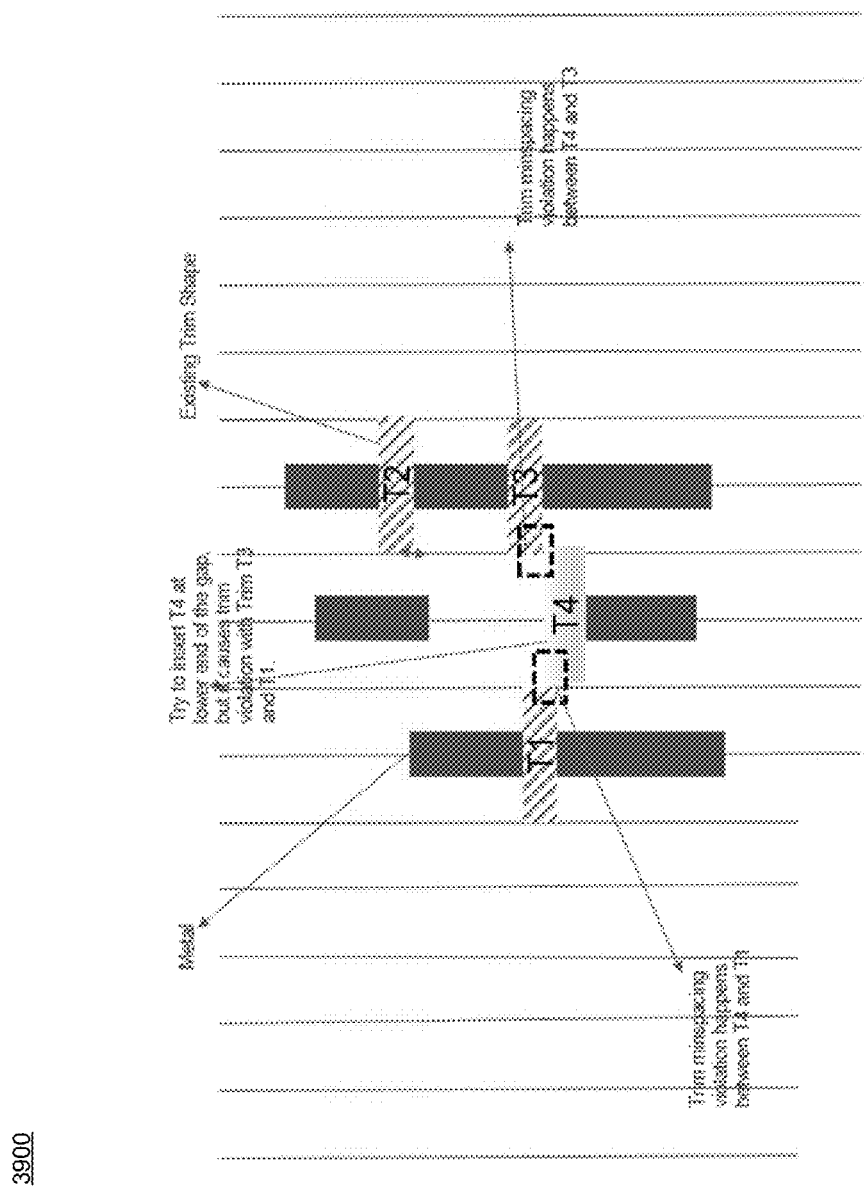
FIG. 39 is a diagram depicting an embodiment incorporating display process in accordance with the present disclosure.
Figure 40:
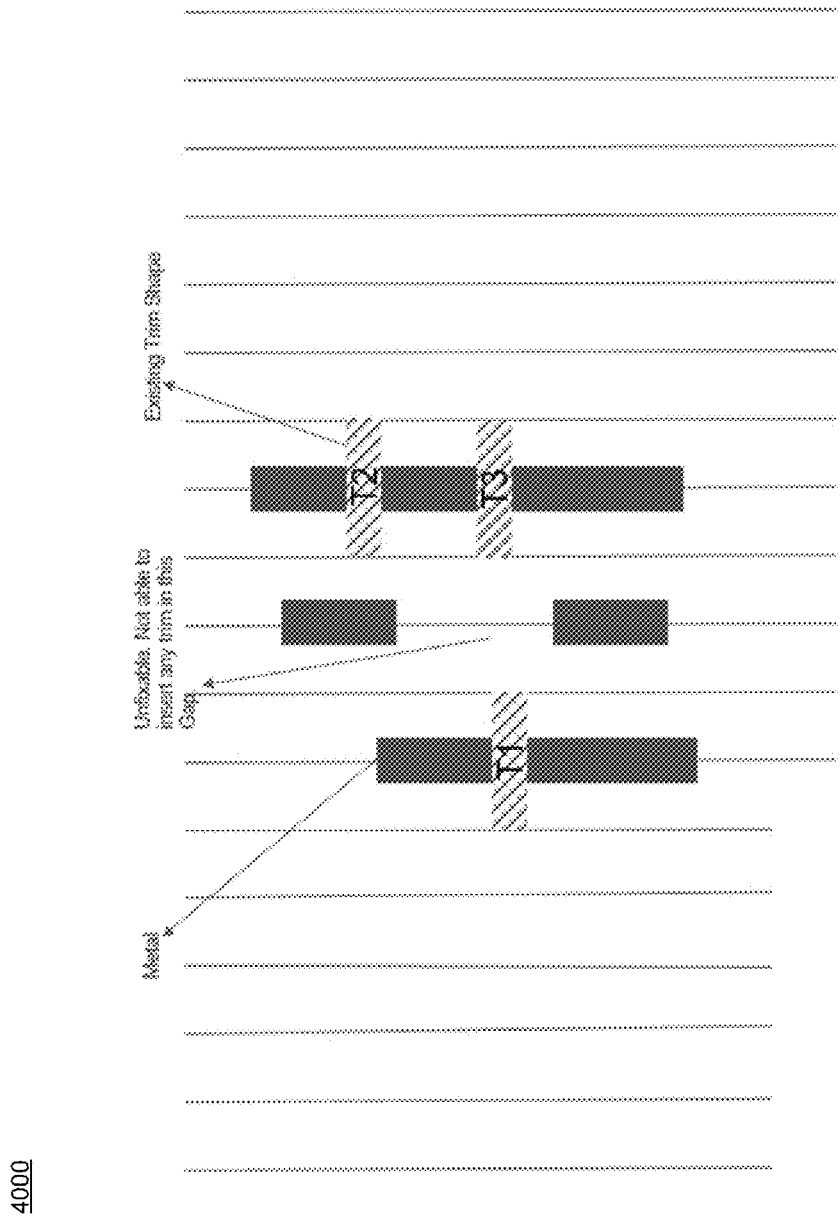
FIG. 40 is a diagram depicting an embodiment incorporating display process in accordance with the present disclosure.

Referring also to FIG. 38, an example is provided which first attempts to insert trim at the top end of the gap (e.g., attempt to insert trim T4). However, this results in a trim spacing violation with T2, which is suboptimal. Prior approaches, as shown in FIG. 39, may then attempt to insert trim at the bottom of the gap (e.g. T4). However, there is a violation with T1 and T3, so it is also suboptimal. FIG. 40 reflects the problems with previous attempts as the problem appears to be unfixable as it has not attempted all of the possible locations to insert trim.

Figure 41:
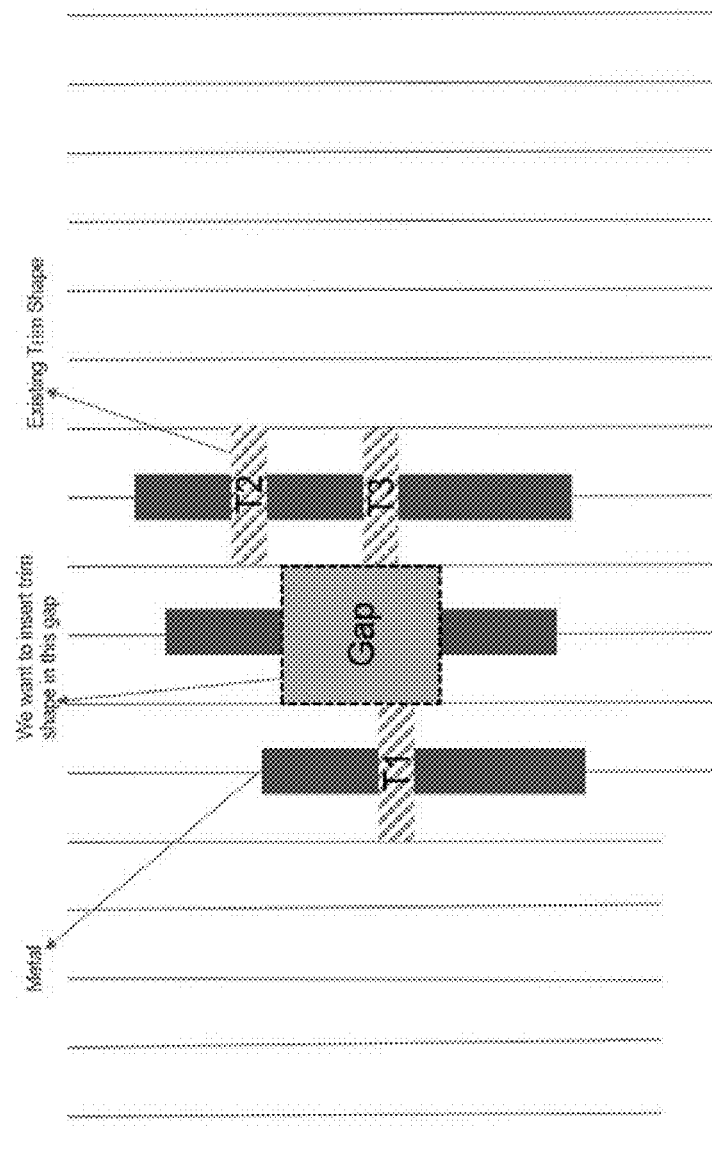
FIG. 41 is a diagram depicting an embodiment incorporating display process in accordance with the present disclosure.

Referring also to FIG. 41, an embodiment of display process 10 showing the interactive trim fixer approach included herein is provided. This particular example illustrates the problem wherein one or more metal shapes and existing trim shapes exist and a trim shape may need to be inserted in a gap portion of the design.

Figure 42:
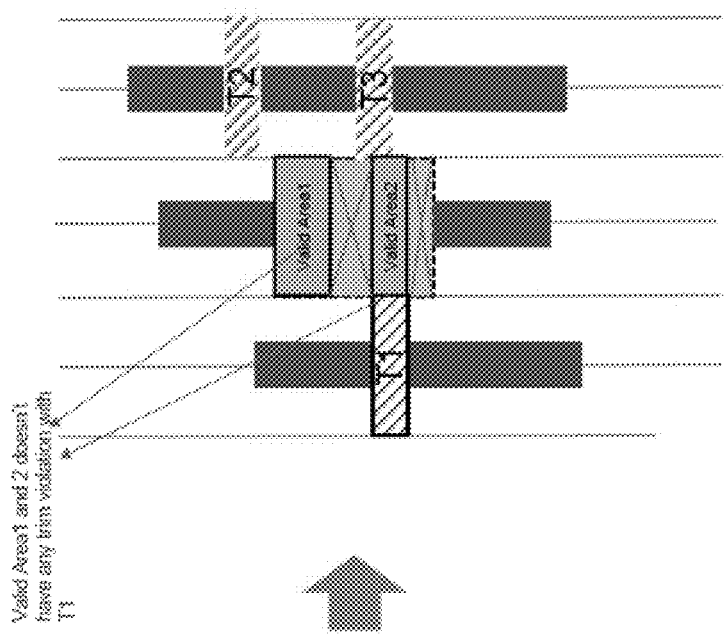
FIG. 42 is a diagram depicting an embodiment incorporating display process in accordance with the present disclosure.
Figure 42:
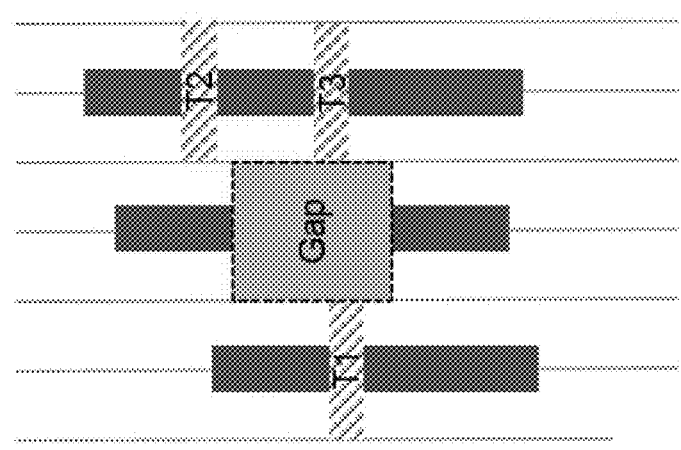

Referring also to FIG. 42, an embodiment of display process 10 showing the automatic determination of valid trim areas is provided. In this particular example, display process 10 may determine the valid areas from the gap portion. These "valid" areas are those that do not have any violation with Trim T1. In some embodiments, the valid areas may be calculated by running a trim spacing checker. As shown in FIG. 42, display process 10 may also be configured to display the invalid areas within the gap, which are shown in the "x" portion.

Figure 43:
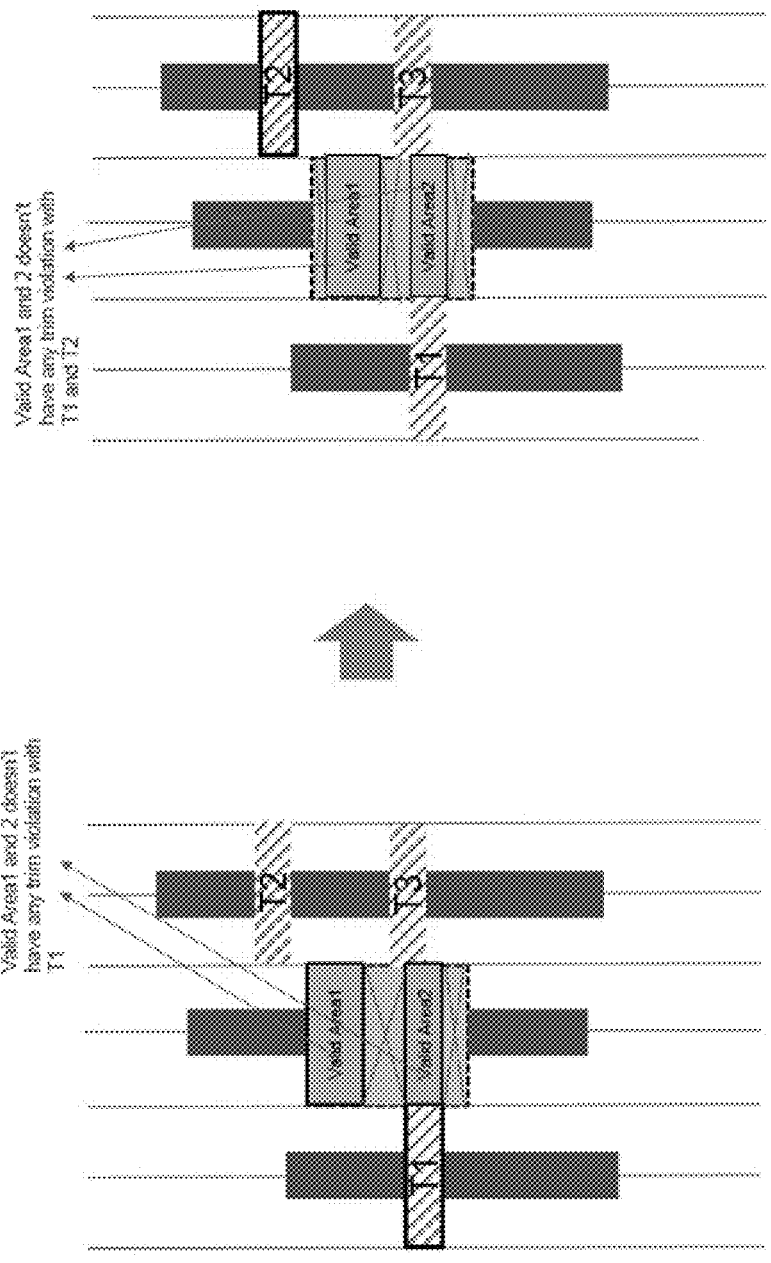
FIG. 43 is a diagram depicting an embodiment incorporating display process in accordance with the present disclosure.
Figure 44:
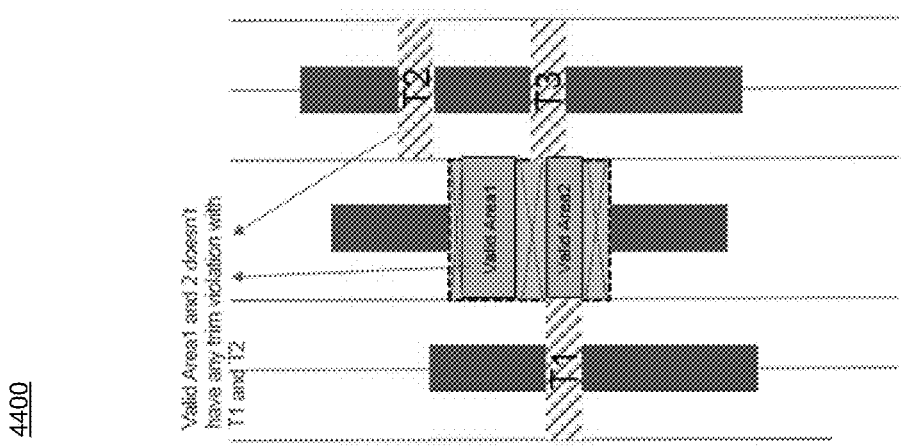
FIG. 44 is a diagram depicting an embodiment incorporating display process in accordance with the present disclosure.
Figure 44:
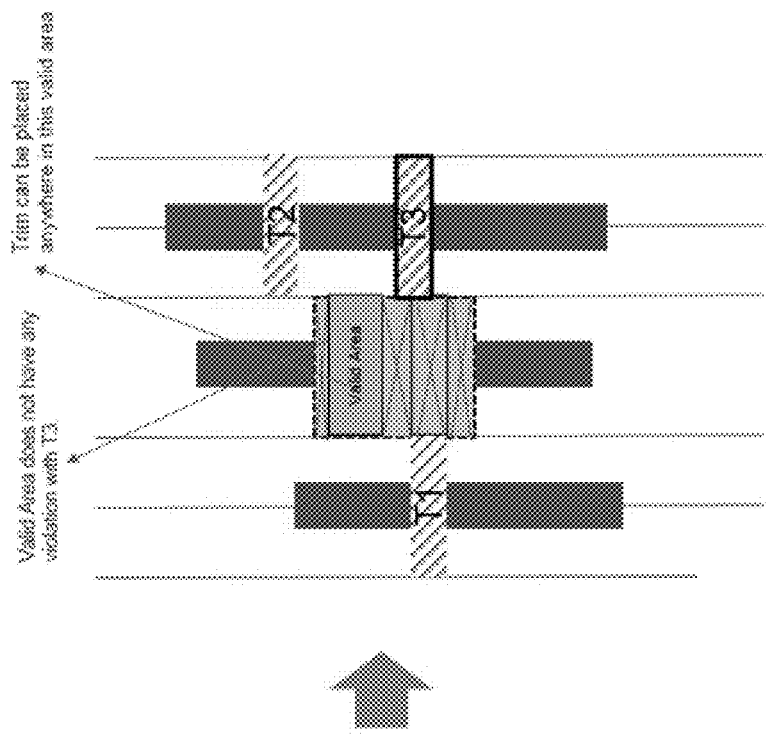

Referring also to FIG. 43, an embodiment of display process 10 showing the automatic determination of valid trim areas is provided. In this particular example, display process 10 may be configured to further trim the valid areas so that there are no trim violations with trim T2. Similarly, in FIG. 44, the valid areas have been trimmed further so that there are no violations with T3. The valid trim area shown in the right side of FIG. 44 depicts the valid area, in which trim may be placed.

Figure 45:
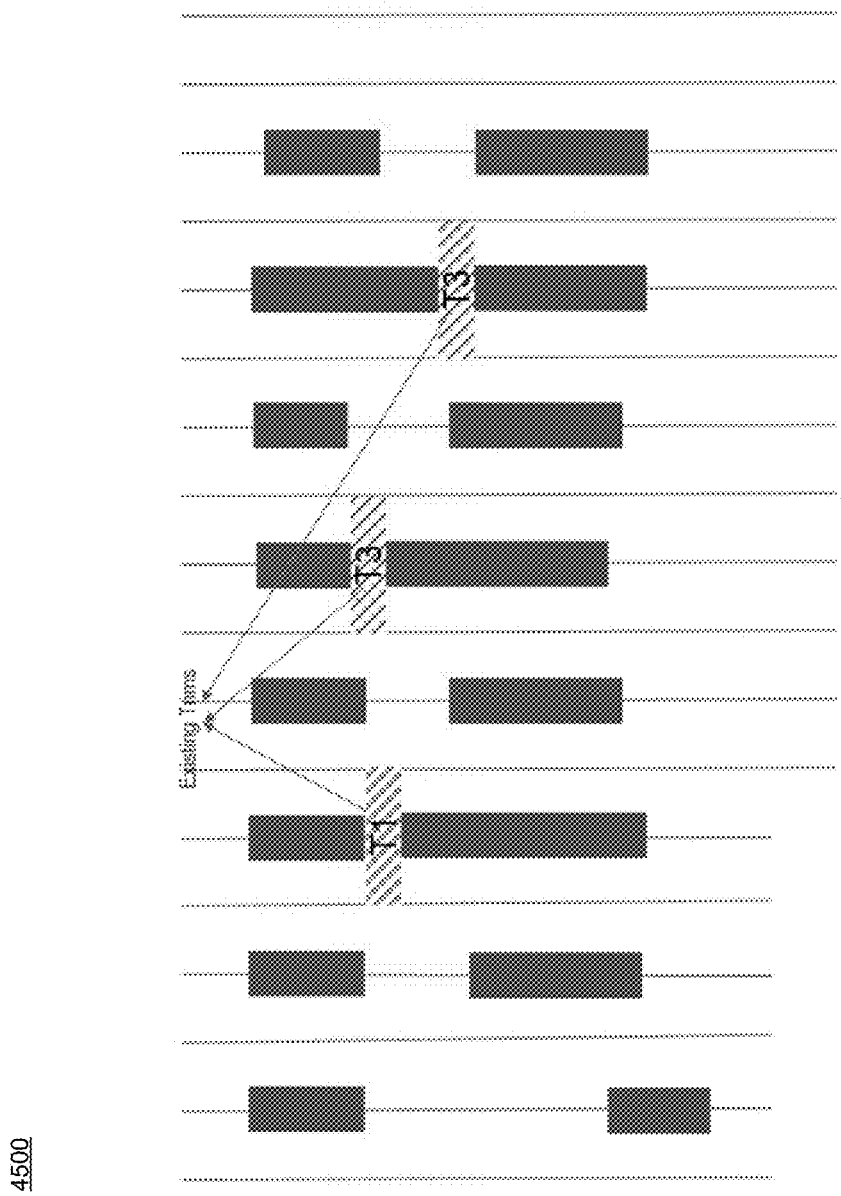
FIG. 45 is a diagram depicting an embodiment incorporating display process in accordance with the present disclosure.

Referring also to FIG. 45, an embodiment of display process 10 showing the automatic determination of valid trim areas is provided. In this particular example, a design is shown in which some trims are already present. These trims can be at level 1, which is unable to be modified. Additionally and/or alternatively, this may be a snapshot of a design generated from a batch trim fixer, which requires manual intervention to place other trims. The designer may desire to insert trim in the remaining area.

Figure 46:
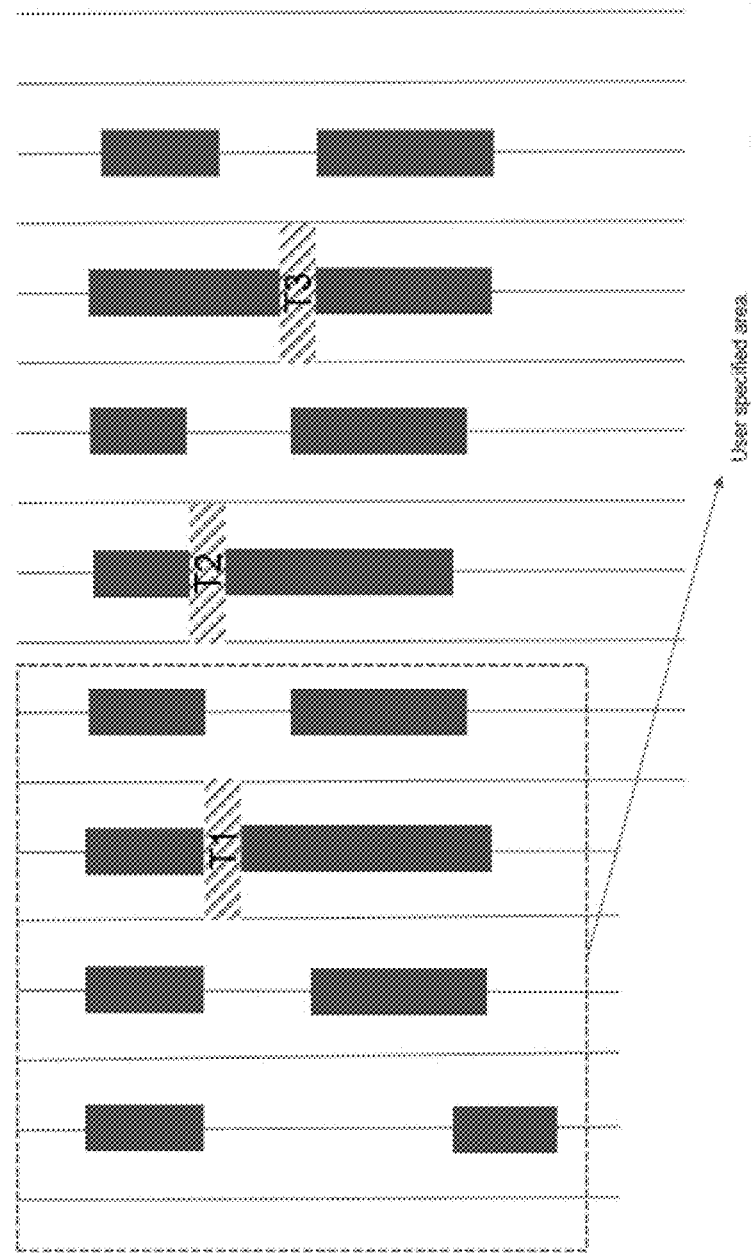
FIG. 46 is a diagram depicting an embodiment incorporating display process in accordance with the present disclosure.
Figure 47:
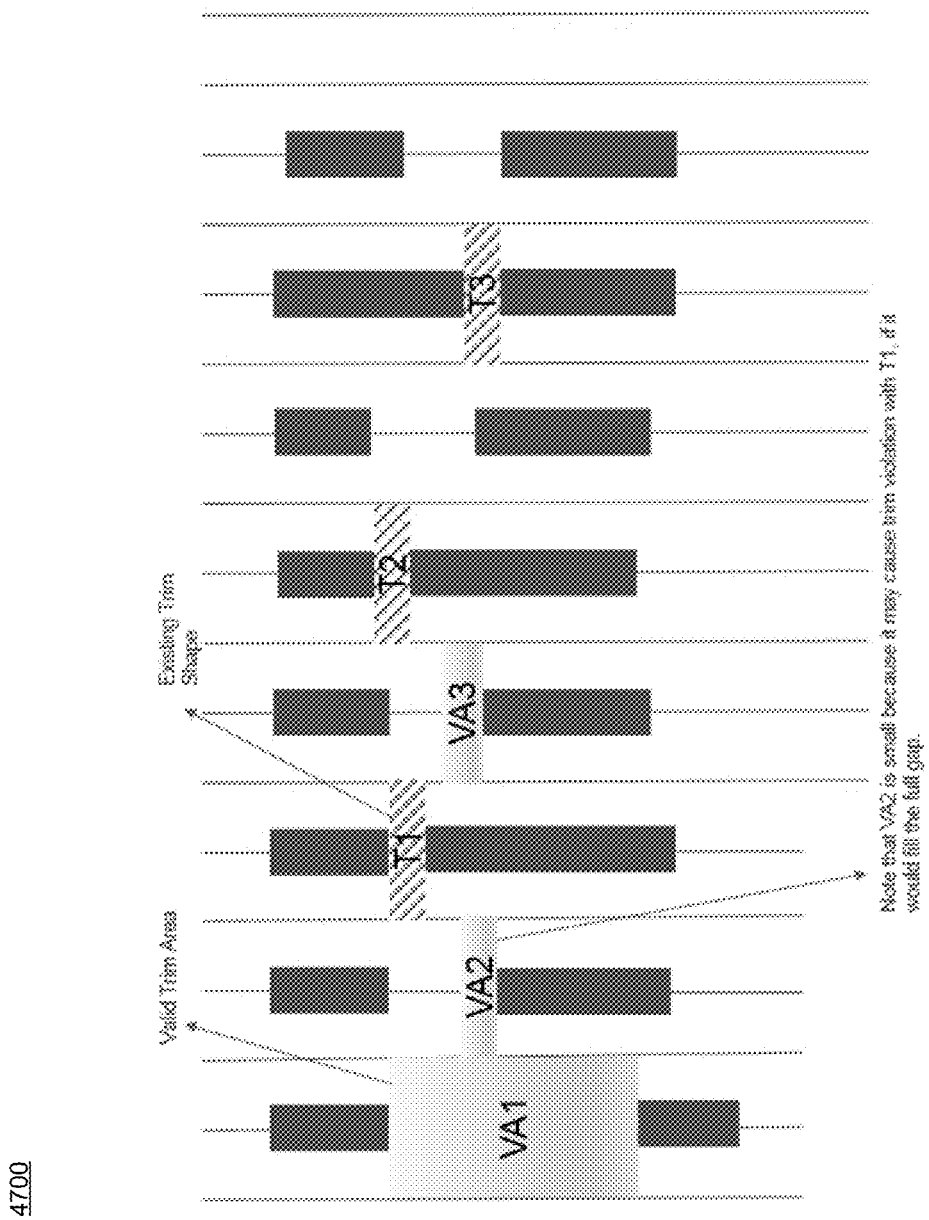
FIG. 47 is a diagram depicting an embodiment incorporating display process in accordance with the present disclosure.
Figure 48:
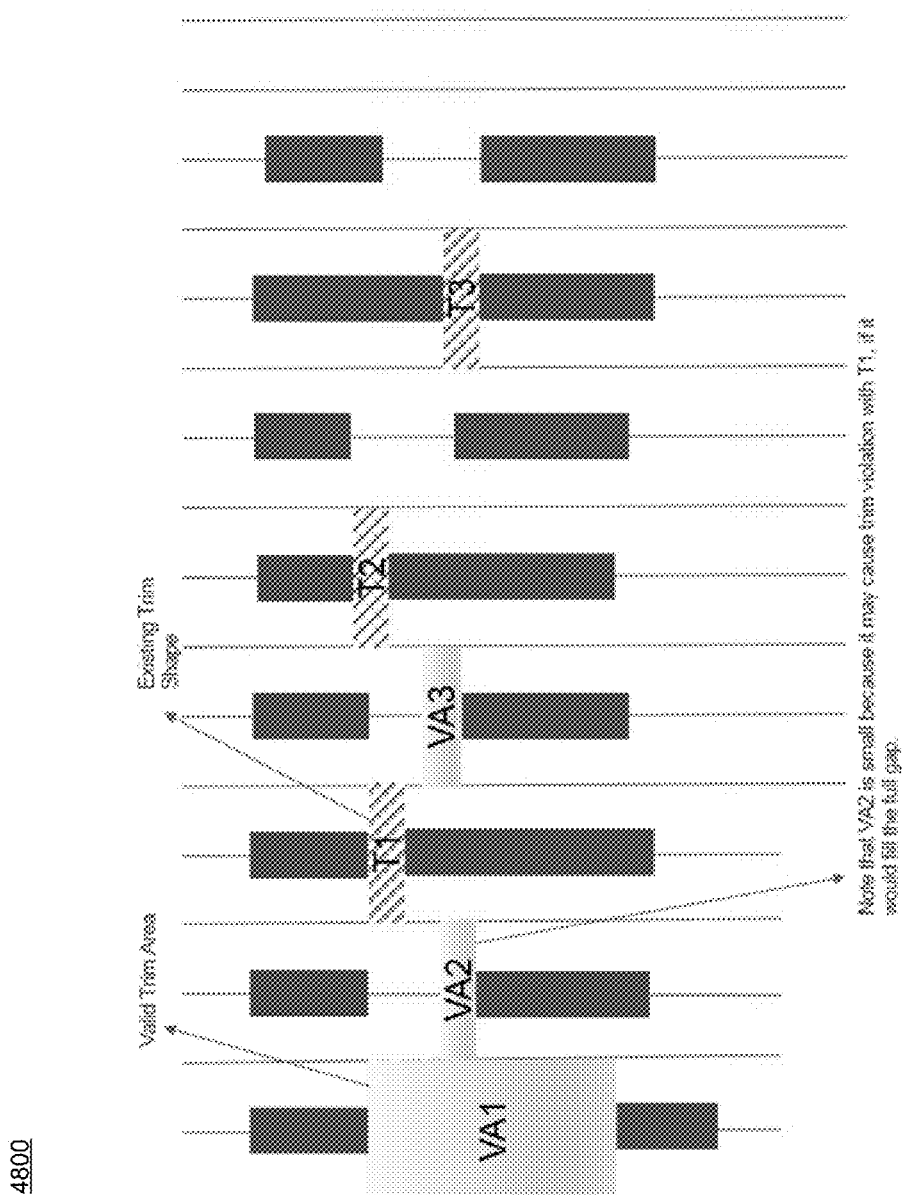
FIG. 48 is a diagram depicting an embodiment incorporating display process in accordance with the present disclosure.

In operation, and referring to FIGS. 46-53, a user may select a particular area as shown in FIGS. 46-47 and select the interactive trim fixer option. FIG. 48 shows an example where some valid trim areas are generated so that valid areas do not have any violations with existing trims. Accordingly, the user may insert trim in any valid area. On insertion, display process 10 may be configured to automatically recalculate the other valid areas. As such, immediate feedback may be displayed to user about the effects of adding trim at this location. If the user dislikes the result, the operation may be undone and another location may be selected.

Figure 49:
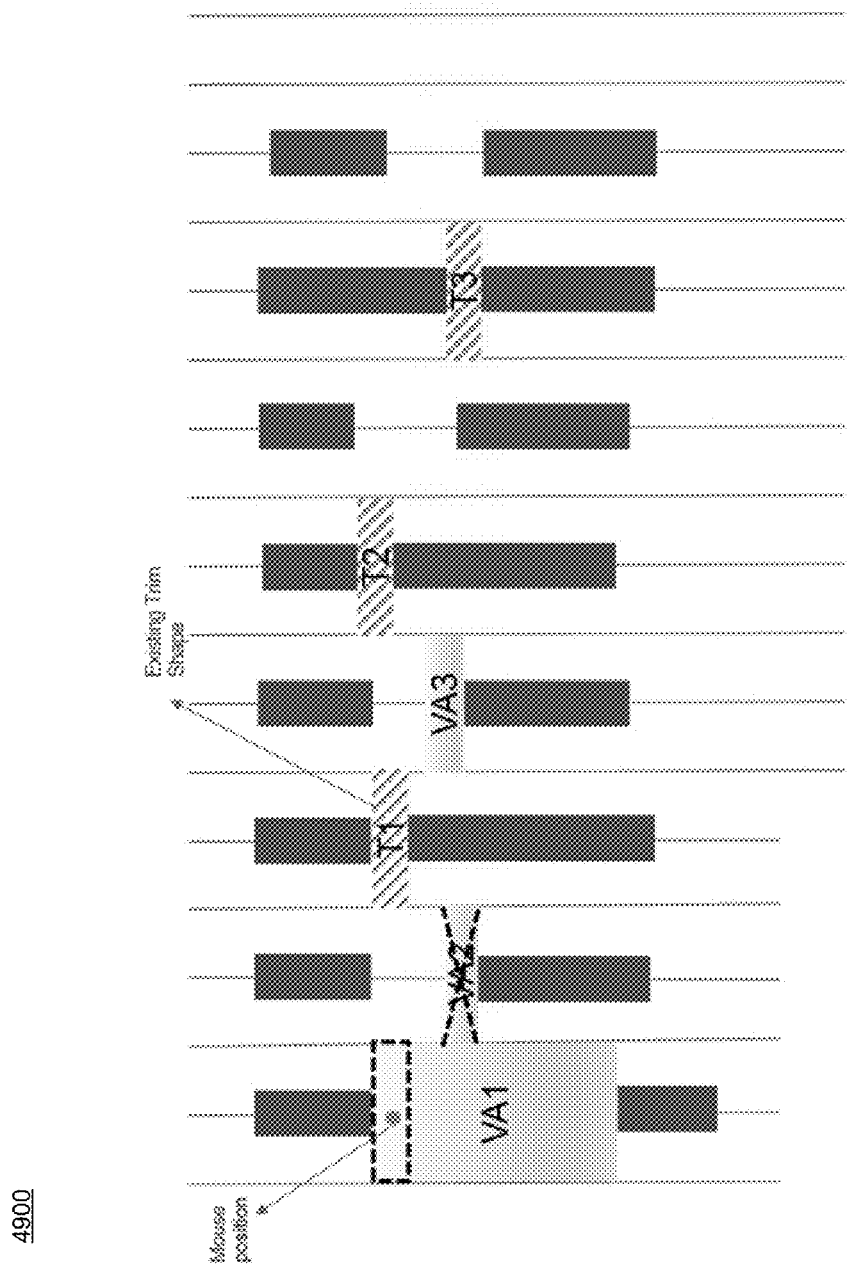
FIG. 49 is a diagram depicting an embodiment incorporating display process in accordance with the present disclosure.
Figure 50:
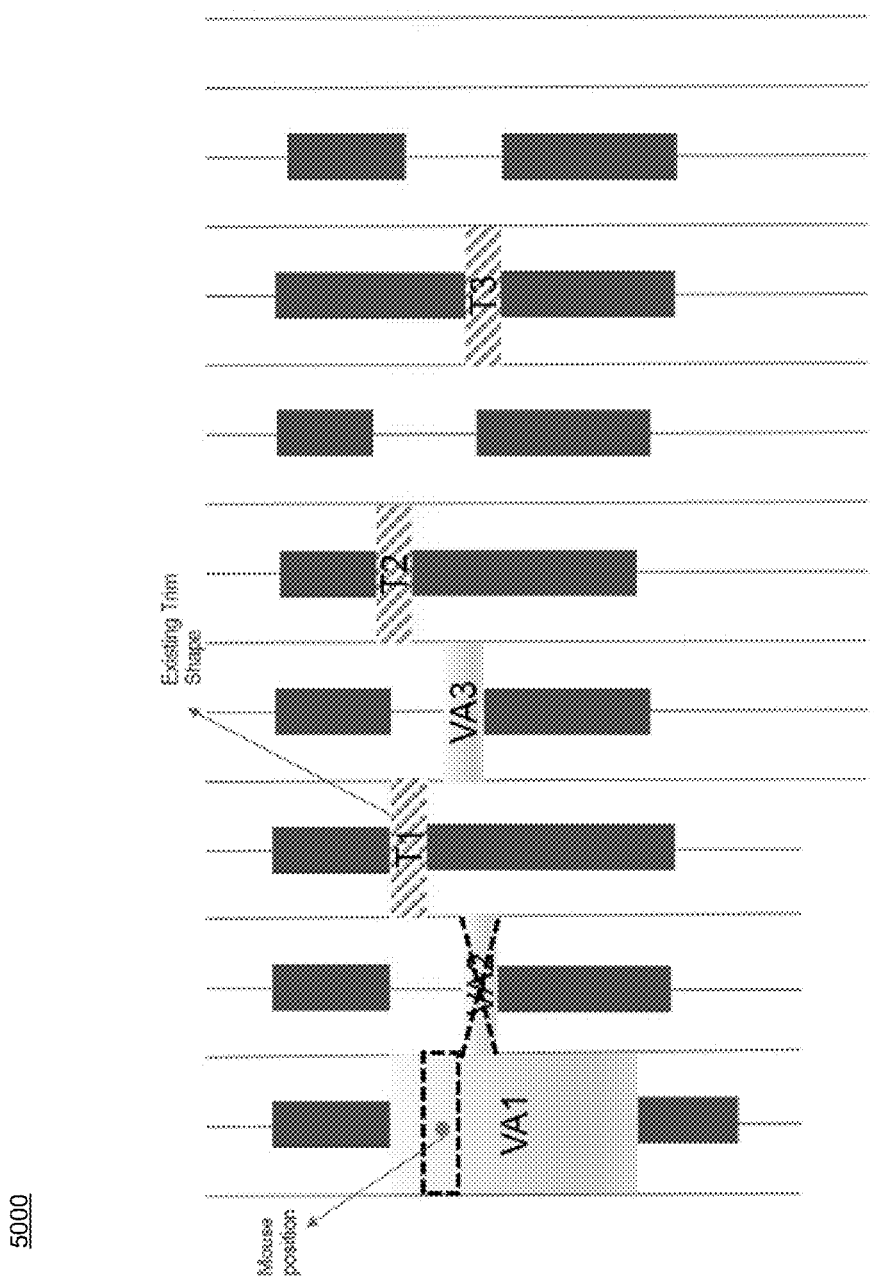
FIG. 50 is a diagram depicting an embodiment incorporating display process in accordance with the present disclosure.
Figure 51:
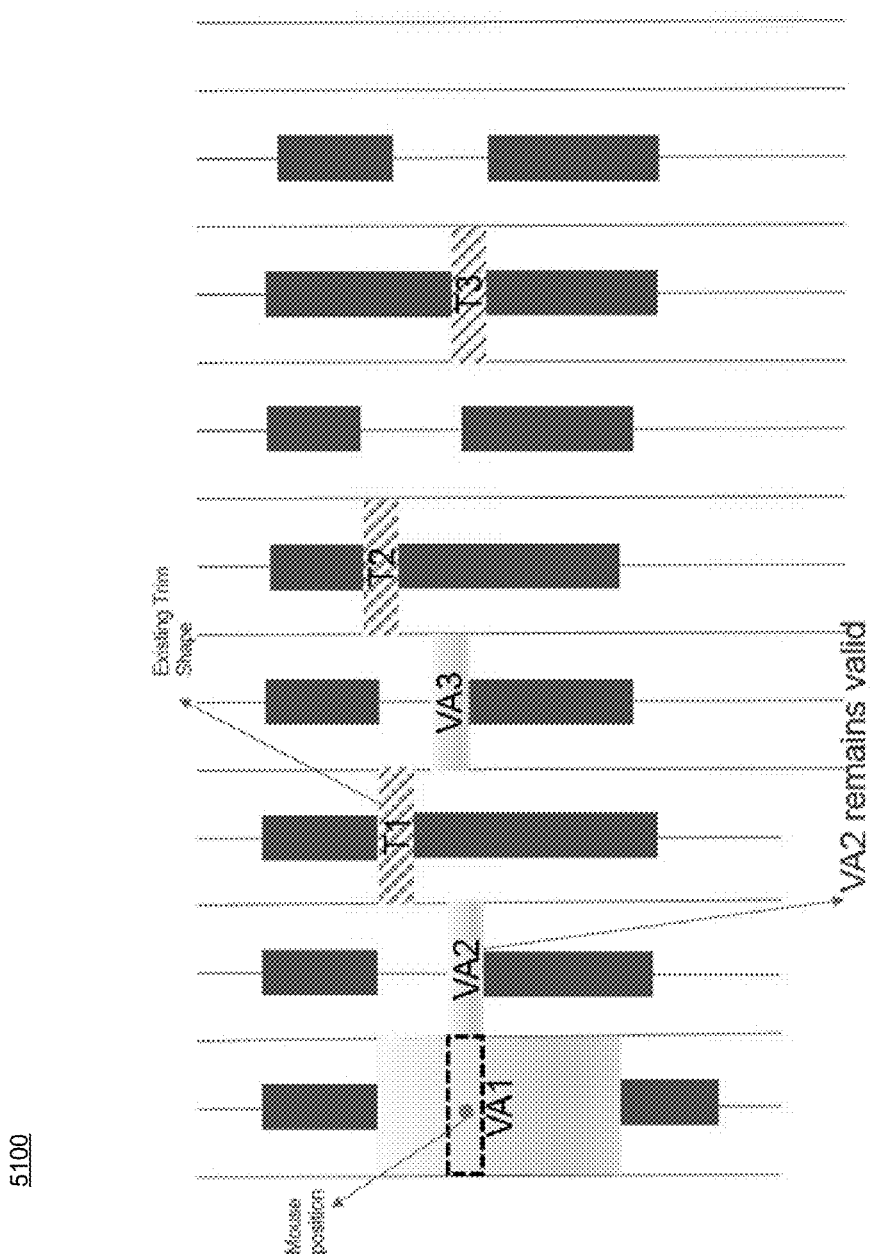
FIG. 51 is a diagram depicting an embodiment incorporating display process in accordance with the present disclosure.
Figure 52:
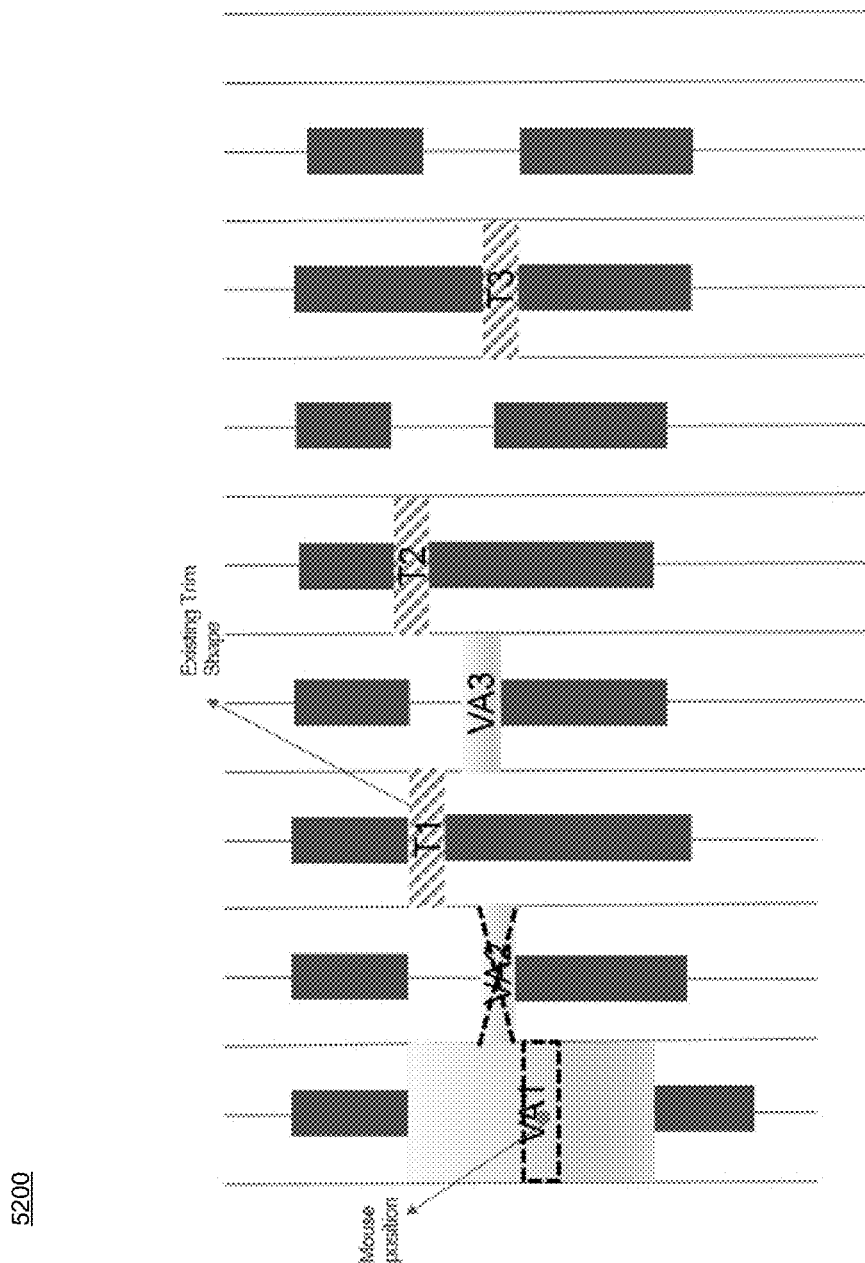
FIG. 52 is a diagram depicting an embodiment incorporating display process in accordance with the present disclosure.
Figure 53:
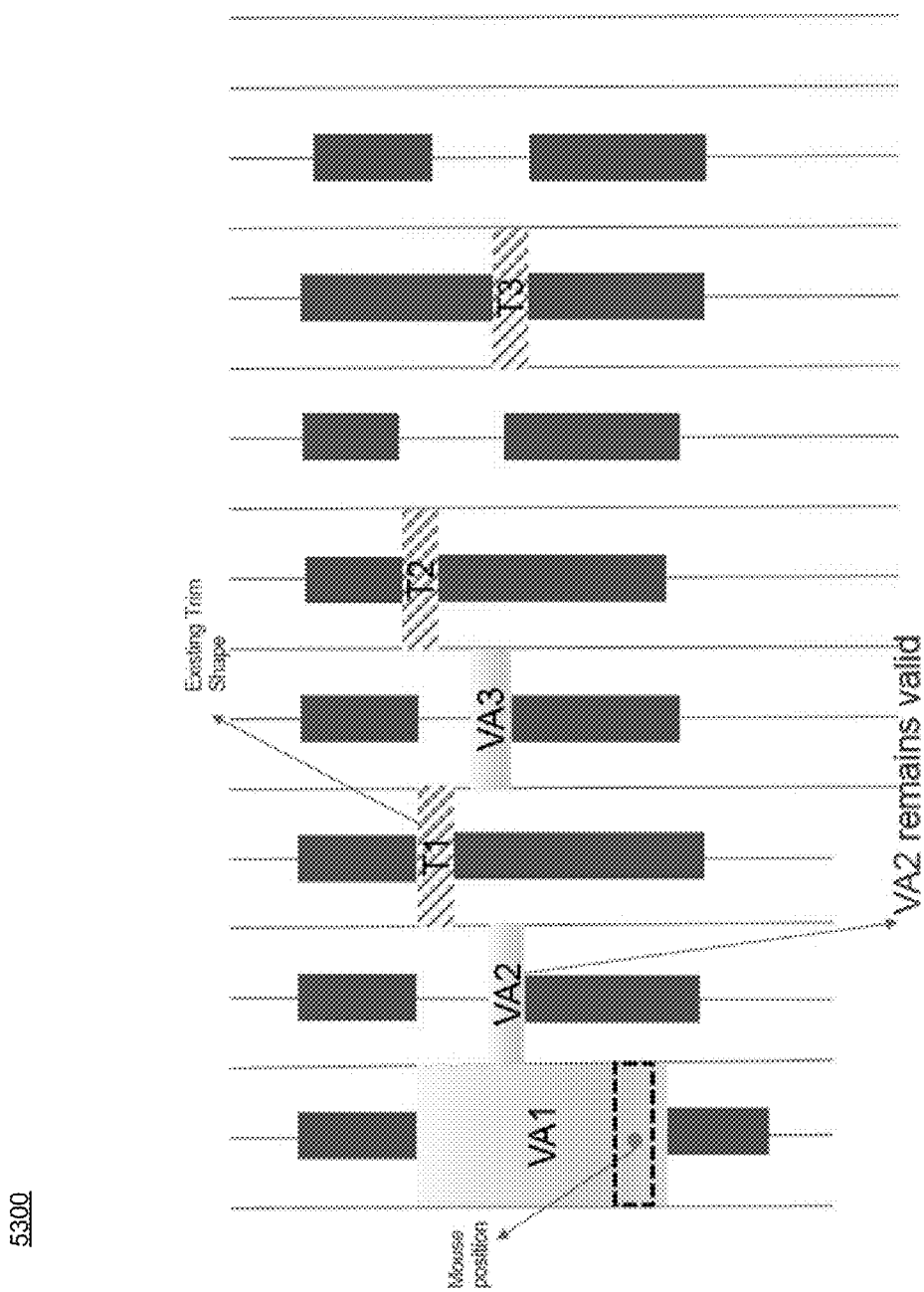
FIG. 53 is a diagram depicting an embodiment incorporating display process in accordance with the present disclosure.
Figure 54:
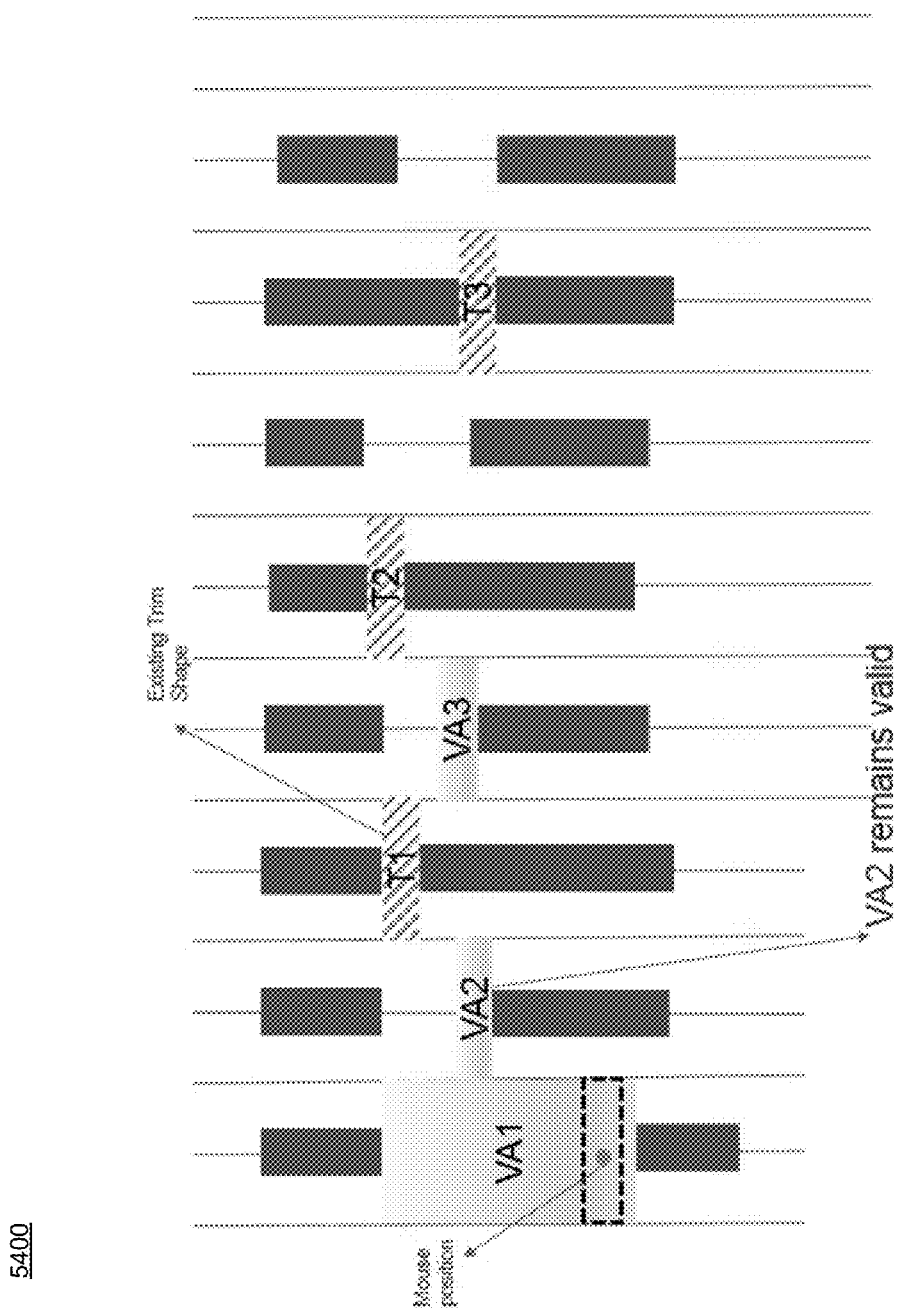
FIG. 54 is a diagram depicting an embodiment incorporating display process in accordance with the present disclosure.

Referring also to FIG. 49-55, embodiments of display process 10 showing screenshots of the dynamic operations of display process 10 are provided. In FIG. 49, the user may interactively select various location in VA1 to insert the trim. And its effect on neighboring valid area (VA2) is immediately reflected. The user has the flexibility to start with any valid area. Accordingly, display process 10 may provide immediate visual feedback based on his actions. The user may select and manipulate on the graphical user interface using any suitable action. For example, the user may move his or her mouse at VA1 to insert the trim shape, and VA2 may be updated automatically providing instant feedback.

In some embodiments, display process 10 may be configured to calculate the valid areas where trim can be inserted by pruning the available areas by running a series of spacing calculators. Accordingly, the user may be able to visualize all valid areas, and then select any one location to fix. A fixer engine may, in real-time, generate a valid trim shape and compute and update the adjoining valid areas. As such, the user has the flexibility to try out various combinations, which was not possible with previous approaches.

In some embodiments, EDA application 20 may support a variety of languages and/or standards. Some of these may include, but are not limited to, IEEE-standard languages, the Open Verification Methodology (OVM), the emerging Accellera Universal Verification Methodology (UVM), and the e Reuse Methodology (eRM). EDA application 20 may support e, Open Verification Library (OVL), OVM class library, emerging UVM class library, SystemC®, SystemC Verification Library, SystemVerilog, Verilog®, VHDL, PSL, SVA, CPF, as well as numerous other languages. EDA application 20 may be used in accordance with mixed-language, mixed-signal, and low-power designs, across multiple levels of abstraction, and may include the ability to "hot swap" the RTL simulation in/out of numerous accelerators/emulators.

As used in any embodiment described herein, the terms "circuit" and "circuitry" may include, for example, singly or in any combination, hardwired circuitry, programmable circuitry, state machine circuitry, and/or firmware that stores instructions executed by programmable circuitry. It should be understood at the outset that any of the operations and/or operative components described in any embodiment herein may be implemented in software, firmware, hardwired circuitry and/or any combination thereof. Embodiments of the present disclosure may be incorporated in whole or in part into any design tools.

As will be appreciated by one skilled in the art, the present disclosure may be embodied as a method, system, or computer program product. Accordingly, the present disclosure may take the form of an entirely hardware embodiment, an entirely software embodiment (including firmware, resident software, micro-code, etc.) or an embodiment combining software and hardware aspects that may all generally be referred to herein as a "circuit," "module" or "system."

Furthermore, the present disclosure may take the form of a computer program product on a computer-usable storage medium having computer-usable program code embodied in the medium.

Any suitable computer usable or computer readable medium may be utilized. The computer readable medium may be a computer readable signal medium or a computer readable storage medium. A computer-usable, or computer-readable, storage medium (including a storage device associated with a computing device or client electronic device) may be, for example, but not limited to, an electronic, magnetic, optical, electromagnetic, infrared, or semiconductor system, apparatus, or device, or any suitable combination of the foregoing. More specific examples (a non-exhaustive list) of the computer-readable medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device. In the context of this document, a computer-usable, or computer-readable, storage medium may be any tangible medium that can contain, or store a program for use by or in connection with the instruction execution system, apparatus, or device.

A computer readable signal medium may include a propagated data signal with computer readable program coded embodied therein, for example, in baseband or as part of a carrier wave. Such a propagated signal may take any of a variety of forms, including, but not limited to, electromagnetic, optical, or any suitable combination thereof. A computer readable signal medium may be any computer readable medium that is not a computer readable storage medium and that can communicate, propagate, or transport a program for use by or in connection with an instruction execution system, apparatus, or device. Program code embodied on a computer readable medium may be transmitted using any appropriate medium, including but not limited to wireless, wireline, optical fiber cable, RF, etc., or any suitable combination of the foregoing.

Computer program code for carrying out operations of the present disclosure may be written in an object oriented programming language such as Java, Smalltalk, C++ or the like. However, the computer program code for carrying out operations of the present disclosure may also be written in conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through a local area network (LAN) or a wide area network (WAN), or the connection may be made to an external computer (for example, through the Internet using an Internet Service Provider).

The present disclosure is described below with reference to flowchart illustrations and/or block diagrams of methods, apparatus (systems) and computer program products according to embodiments of the disclosure. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer-readable memory that can direct a computer or other programmable data processing apparatus to function in a particular manner, such that the instructions stored in the computer-readable memory produce an article of manufacture including instructions which implement the function/act specified in the flowchart and/or block diagram block or blocks.

The computer program instructions may also be loaded onto a computer or other programmable data processing apparatus to cause a series of operational steps to be performed on the computer or other programmable apparatus to produce a computer implemented process such that the instructions which execute on the computer or other programmable apparatus provide steps for implementing the functions/acts specified in the flowchart and/or block diagram block or blocks.

It will be apparent to those skilled in the art that various modifications and variations can be made in the embodiments of the present disclosure without departing from the spirit or scope of the present disclosure. Thus, it is intended that embodiments of the present disclosure cover the modifications and variations provided they come within the scope of the appended claims and their equivalents.

What is claimed is:

1. A method for visualization of fixing of design rule violations in an electronic circuit design comprising:
    displaying at a graphical user interface at least a portion of an electronic design having at least one shape associated therewith;
    identifying one or more electronic design rules associated with the at least one shape;
    in response to identifying, determining a proposed shape based upon, at least in part, the one or more electronic design rules associated with the at least one shape, wherein the proposed shape is at least one of a trim shape, a bridge shape including one or more metal shapes configured to fill a space underneath the trim shape, and a patch shape including a shape configured to fill a space between the trim shape and a line end; and
    displaying the proposed shape at the graphical user interface, wherein the proposed shape includes at least two of the trim shape, the bridge shape, and the patch shape.

2. The method of claim 1, further comprising:
    identifying a line end violation associated with the electronic design.

3. The method of claim 2, further comprising:
    displaying the line end violation at the graphical user interface.

4. The method of claim 1, wherein displaying at a graphical user interface at least a portion of an electronic design includes displaying a first static portion of the design and displaying a portion of the electronic design that is configured to dynamically change upon user selection.

5. The method of claim 4, wherein the proposed shape connects the first static portion of the electronic design and the portion of the electronic design that is configured to dynamically change upon user selection.

6. The method of claim 4, wherein the portion of the electronic design that is configured to dynamically change upon user selection includes a wire.

7. The method of claim 1, further comprising:
    allowing, at the graphical user interface a user to select a sub-portion of the electronic design within to display the proposed shape.

8. The method of claim 1, wherein displaying the proposed shape includes displaying the trim shape, the bridge shape, and the patch shape at the graphical user interface.

9. A system for visualization of fixing of design rule violations in an electronic circuit design comprising:
    a computing device having at least one processor configured to display at a graphical user interface at least a portion of an electronic design having at least one shape associated therewith, the computing device further configured to identify one or more electronic design rules associated with the at least one shape, and in response to identifying, the computing device further configured to determine a proposed shape based upon, at least in part, the one or more electronic design rules associated with the at least one shape, wherein the proposed shape is at least one of a trim shape, a bridge shape including one or more metal shapes configured to fill a space underneath the trim shape, and a patch shape including a shape configured to fill a space between the trim shape and a line end, the computing device configured to display the proposed shape at the graphical user interface, wherein the proposed shape includes at least two of the trim shape, the bridge shape, and the patch shape.

10. The system of claim 9, wherein the computing device is further configured to identify a line end violation associated with the electronic design.

11. The system of claim 10, wherein the computing device is further configured to displaying the line end violation at the graphical user interface.

12. The system of claim 9, wherein displaying at a graphical user interface at least a portion of an electronic design includes displaying a first static portion of the design and displaying a portion of the electronic design that is configured to dynamically change upon user selection.

13. The system of claim 12, wherein the proposed shape connects the first static portion of the electronic design and the portion of the electronic design that is configured to dynamically change upon user selection.

14. The system of claim 12, wherein the portion of the electronic design that is configured to dynamically change upon user selection includes a wire.

15. The system of claim 9, wherein the computing device is further configured to allow a user to select a sub-portion of the electronic design within to display the proposed shape at the graphical user interface.

16. The system of claim 9, wherein displaying the proposed shape includes displaying the trim shape, the bridge shape, and the patch shape at the graphical user interface.

17. A non-transitory computer readable medium having stored thereon instructions, which when executed by a processor result in one or more operations, the operations comprising:
    displaying at a graphical user interface at least a portion of an electronic design having at least one shape associated therewith;
    identifying one or more electronic design rules associated with the at least one shape;
    in response to identifying, determining a proposed shape based upon, at least in part, the one or more electronic design rules associated with the at least one shape, wherein the proposed shape is at least one of a trim shape, a bridge shape including one or more metal shapes configured to fill a space underneath the trim shape, and a patch shape including a shape configured to fill a space between the trim shape and a line end; and displaying the proposed shape at the graphical user interface, wherein the proposed shape includes at least two of the trim shape, the bridge shape, and the patch shape.

18. The non-transitory computer readable medium of claim 17, wherein operations further comprise:
identifying a line end violation associated with the electronic design.

19. The non-transitory computer readable medium of claim 18, wherein operations further comprise:
displaying the line end violation at the graphical user interface.

20. The non-transitory computer readable medium of claim 17, wherein displaying the proposed shape includes displaying the trim shape, the bridge shape, and the patch shape at the graphical user interface.

* * * * *